US012809258B2

(12) United States Patent
Endo

(10) Patent No.: US 12,809,258 B2
(45) Date of Patent: Nov. 24, 2026

(54) CHEMICAL-RESISTANT POLYVALENT CARBOXYLIC ACID-CONTAINING PROTECTIVE FILM

(71) Applicant: NISSAN CHEMICAL CORPORATION, Tokyo (JP)

(72) Inventor: Takafumi Endo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 1057 days.

(21) Appl. No.: 17/765,722

(22) PCT Filed: Oct. 27, 2020

(86) PCT No.: PCT/JP2020/040162

§ 371 (c)(1),
(2) Date: Mar. 31, 2022

(87) PCT Pub. No.: WO2021/085397

PCT Pub. Date: May 6, 2021

(65) Prior Publication Data

US 2022/0404706 A1 Dec. 22, 2022

(30) Foreign Application Priority Data

Oct. 28, 2019 (JP) ................................ 2019-195504

(51) Int. Cl.

| | |
|---|---|
| ***G03F 7/11*** | (2006.01) |
| ***C09D 7/63*** | (2018.01) |
| ***C09D 163/00*** | (2006.01) |
| ***G03F 7/30*** | (2006.01) |
| ***G03F 7/40*** | (2006.01) |
| ***H10P 76/20*** | (2026.01) |
| *G03F 7/16* | (2006.01) |
| *G03F 7/20* | (2006.01) |
| *H10P 50/00* | (2026.01) |

(52) U.S. Cl.

CPC .................. *G03F 7/11* (2013.01); *C09D 7/63* (2018.01); *C09D 163/00* (2013.01); *H10P 50/73* (2026.01); *H10P 76/204* (2026.01); *G03F 7/16* (2013.01); *G03F 7/20* (2013.01); *G03F 7/30* (2013.01); *H10P 50/692* (2026.01); *H10P 50/71* (2026.01)

(58) Field of Classification Search

CPC .......... G03F 7/037; G03F 7/0387; G03F 7/11; G03F 7/30; G03F 7/40

See application file for complete search history.

(56) References Cited

U.S. PATENT DOCUMENTS

| | | | | |
|---|---|---|---|---|
| 2010/0084172 A1* | 4/2010 | Funaki | C08F 283/00 174/258 |
| 2010/0116532 A1* | 5/2010 | Funaki | G03F 7/037 522/75 |
| 2012/0038996 A1* | 2/2012 | Kura | G03F 7/028 430/7 |
| 2014/0134355 A1* | 5/2014 | Mazany | D06N 3/0059 442/141 |
| 2015/0338934 A1* | 11/2015 | Hawkins | G06F 1/1615 345/157 |
| 2018/0267405 A1* | 9/2018 | Kamemoto | C08G 69/32 |
| 2019/0033719 A1* | 1/2019 | Cole | C08F 220/1811 |
| 2020/0131376 A1 | 4/2020 | Tokunaga et al. | |
| 2020/0183282 A1 | 6/2020 | Hashimoto et al. | |

FOREIGN PATENT DOCUMENTS

| | | | |
|---|---|---|---|
| EP | 0126541 A1 * | 11/1984 | G03F 7/031 |
| JP | 2010-217306 A | 9/2010 | |
| WO | 2018/052130 A1 | 3/2018 | |
| WO | 2018/203464 A1 | 11/2018 | |

OTHER PUBLICATIONS

Jan. 26, 2021 International Search Report issued in International Patent Application No. PCT/JP2020/040162.

May 3, 2022 International Preliminary Report on Patentability issued in International Patent Application No. PCT/JP2020/040162.

* cited by examiner

*Primary Examiner* — John S. Chu

(74) *Attorney, Agent, or Firm* — Oliff PLC

(57) ABSTRACT

A protective film forming composition which has a good mask (protection) function against a wet etching liquid and a high dry etching rate during processing of a semiconductor substrate and also has good coverage even for a stepped substrate, and from which a flat film can be formed due to a small difference in film thickness after being embedded; a protective film produced using the composition; a substrate with a resist pattern; and a method for producing a semiconductor device. This composition contains: (A) a compound having three or more carboxyl groups; (B) a resin or a monomer; and a solvent. The compound (A) having three or more carboxyl groups preferably has a ring structure. This ring structure is preferably selected from among an aromatic ring having 6-40 carbon atoms, an aliphatic ring having 3-10 carbon atoms, and a heterocyclic ring.

15 Claims, No Drawings

CHEMICAL-RESISTANT POLYVALENT CARBOXYLIC ACID-CONTAINING PROTECTIVE FILM

TECHNICAL FIELD

The present invention relates to a composition forming a protective film having excellent resistance particularly to a wet etching liquid for semiconductor, in a lithography process in the production of a semiconductor. In addition, the present invention relates to a method for producing a substrate having a resist pattern to which the protective film is applied, and a method for producing a semiconductor device.

BACKGROUND ART

In the production of a semiconductor has been widely known a lithography process, in which a resist underlying film is formed between a substrate and a resist film formed on the substrate, forming a resist pattern having a desired form. Once the resist pattern is formed, the substrate is processed. Here, dry etching is mainly used in this process; however, wet etching may be used depending on the type of the substrate. Patent Literatures 1 and 2 disclose a protective film forming composition comprising a specific compound against aqueous hydrogen peroxide solution.

CITATION LIST

Patent Literature

Patent Literature 1: WO 2018/052130 A1
Patent Literature 2: WO 2018/203464 A1

SUMMARY OF INVENTION

Technical Problem

In the case where a resist underlying film is used as an etching mask and a base substrate is processed by wet etching, the resist underlying film is required to have a good masking function (i.e., the masked part can protect the substrate) against wet etching liquid used during the processing of the base substrate.

In such case, the resist underlying film is used as a protective film of a substrate. Moreover, when the protective film unnecessary after wet etching is removed by dry etching, a protective film with fast etching speed (high etching rate) that permits swift removal by dry etching is looked for so that the base substrate would not be damaged.

In addition, there is a demand for a protective film forming composition that has a good covering property on the so-called stepped substrate, which can form a flat film with a small difference in film thickness after embedding.

Conventionally, a technique of applying a low-molecular weight compound (e.g. gallic acid) as an additive has been used for exhibiting a resistance to SC-1 (ammonia-hydrogen peroxide solution), which is one of wet etching chemical liquids. However, the technique still has limited efficiency in solving the above-mentioned problem.

An object of the present invention is to solve the above-mentioned problems.

Solution to Problem

The present invention includes the followings:

[1] A protective film forming composition against a wet etching liquid for semiconductor comprising:

(A) a compound comprising at least 3 carboxyl groups;

(B) a resin or monomer, and a solvent.

[2] The protective film forming composition against a wet etching liquid for semiconductor according to [1], wherein the compound comprising at least 3 carboxyl groups (A) has a ring structure. Preferably, the at least 3 carboxyl groups are bound directly or via alkylene groups having 1 to 4 carbon atoms to the ring structure.

[3] The protective film forming composition against a wet etching liquid for semiconductor according to [2], wherein the ring structure is selected from an aromatic ring having 6 to 40 carbon atoms, an aliphatic ring having 3 to 10 carbon atoms, and a heterocyclic ring.

[4] The protective film forming composition against a wet etching liquid for semiconductor according to [3], wherein the aromatic ring having 6 to 40 carbon atoms is selected from benzene, naphthalene, and a compound represented by formula (1):

[Chemical formula 1]

Formula (1)

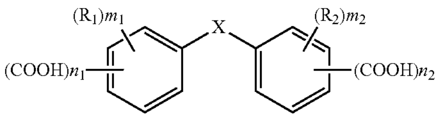

wherein, X is a divalent organic group selected from a direct bond, $-CH_2-$, $-C(CH_3)_2-$, $-CO-$, $-SO_2-$ and $-C(CF_3)_2-$;

each of $R_1$ and $R_2$ independently represents a monovalent organic group selected from an alkyl group having 1 to 4 carbon atoms, a hydroxy group, a cyano group, a nitro group, a halogen atom, and an alkoxy group having 1 to 4 carbon atoms; each of $n_1$ and $n_2$ independently represents an integer of 1 to 9, wherein $n_1+n_2$ is an integer of 3 to 10;

and each of $m_1$ and $m_2$ independently represents an integer of 0 to 7, wherein $m_1+m_2$ is an integer of 0 to 7; or the compound comprising at least 3 carboxyl groups (A) is selected from (i) the compound wherein the aromatic ring having 6 to 40 carbon atoms is benzene or naphthalene, and (ii) a compound represented by formula (1):

[Chemical formula 2]

Formula (1)

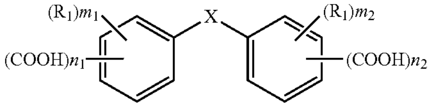

wherein, X is a divalent organic group selected from a direct bond, $-CH_2-$, $-C(CH_3)_2-$, $-CO-$, $-SO_2-$ and $-C(CF_3)_2-$;

each of $R_1$ and $R_2$ independently represents a monovalent organic group selected from an alkyl group having 1 to 4 carbon atoms, a hydroxy group, a cyano group, a nitro group, a halogen atom, and an alkoxy group having 1 to 4 carbon atoms; each of $n_1$ and $n_2$ independently represents an integer of 1 to 9, wherein $n_1+n_2$ is an integer of 3 to 10; and each of $m_1$ and $m_2$ independently represents an integer of 0 to 7, wherein $m_1+m_2$ is an integer of 0 to 7.

[5] The protective film forming composition against a wet etching liquid for semiconductor according to [1], wherein the resin or monomer (B) has at least one hydroxy group in a unit structure of the resin or in the molecule of the monomer.

[6] The protective film forming composition against a wet etching liquid for semiconductor according to any one of [1] to [5], further comprising at least one member selected from the group consisting of cross-linking agent, cross-linking catalyst, and surfactant.

[7] The protective film forming composition against a wet etching liquid for semiconductor according to any one of [1] to [6], wherein the wet etching liquid for semiconductor comprises a hydrogen peroxide solution.

[8] The protective film forming composition against a wet etching liquid for semiconductor according to [7], wherein the hydrogen peroxide solution is an acidic hydrogen peroxide solution.

[9] A protective film against a wet etching liquid for semiconductor, which is a baked product of an applied film of the protective film forming composition according to any one of [1] to [8].

[10] A method for producing a substrate having a resist pattern comprising the steps of:

- applying the protective film forming composition according to any one of [1] to [8] onto a semiconductor substrate and baking the applied composition to form a protective film as a resist underlying film,
- forming a resist film on the protective film, and then
- forming a resist pattern by exposure and development, wherein the substrate having a resist pattern is for manufacturing a semiconductor.

[11] A method for producing a semiconductor device comprising the steps of:

- forming a protective film on a semiconductor substrate optionally having an inorganic film formed on a surface thereof using the protective film forming composition according to any one of [1] to [8];
- forming a resist pattern on the protective film;
- subjecting the protective film to dry etching using the resist pattern as a mask so as to expose a surface of the inorganic film or the semiconductor substrate; and
- while using the dry-etched protective film as a mask, subjecting the inorganic film or the semiconductor substrate to wet etching and/or to washing using a wet etching liquid for semiconductor.

Advantageous Effects of Invention

The protective film forming composition of the present invention is required to have the following properties in good balance, for example, in the lithography process in the semiconductor production: (1) Good masking function against wet etching liquid used during the processing of the base substrate; (2) High dry etching rate, and (3) Superior flattening effect to a stepped substrate. The well-balanced performance of these properties (1)-(3) facilitates micro fabrication of semiconductor substrates.

DESCRIPTION OF EMBODIMENTS

[Protective Film Forming Composition]

The protective film forming composition of the present application is a protective film forming composition against a wet etching liquid for semiconductor comprising:

(A) a compound comprising at least 3 or more carboxyl groups;

(B) a resin or monomer, and a solvent.

The compound comprising at least 3 or more carboxyl groups (A) preferably comprises 3 to 6 carboxyl groups, and more preferably, comprises 3 or 4 carboxyl groups.

The compound comprising at least 3 or more carboxyl groups (A) preferably has a ring structure.

The ring structure is preferably selected from an aromatic ring having 6 to 40 carbon atoms, an aliphatic ring having 3 to 10 carbon atoms, and a heterocyclic ring.

The "aromatic ring having 6 to 40 carbon atom" includes benzene, naphthalene, anthracene, acenaphthene, fluorene, triphenylene, phenalene, phenanthrene, indene, indane, indacene, pyrene, chrysene, perylene, naphthacene, pentacene, coronene, heptacene, benzo[a]anthracene, dibenzophenanthrene, dibenzo[a,j]anthracene, and the like.

The "aliphatic ring having 3 to 10 carbon atoms" includes cyclopropane, cyclobutane, cyclopentane, cyclohexane, cycloheptane, cyclooctane, cyclononane, cyclodecane, spirobicyclopentane, bicyclo[2.1.0]pentane, bicyclo[3.2.1]octane, tricyclo[3.2.1.02,7]octane, spiro[3,4] octane, and the like.

The aromatic ring having 6 to 40 carbon atoms is selected from benzene and naphthalene, or the compound (A) is preferably selected from the compound represented by formula (1):

[Chemical formula 3]

Formula (1)

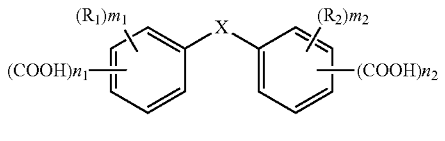

wherein, X is a divalent organic group selected from a direct bond, $—CH_2—$, $—C(CH_3)_2—$, $—CO—$, $—SO_2—$ and $—C(CF_3)_2—$; each of $R_1$ and $R_2$ independently represents a monovalent organic group selected from an alkyl group having 1 to 4 carbon atoms, a hydroxy group, a cyano group, a nitro group, a halogen atom, and an alkoxy group having 1 to 4 carbon atoms; each of $n_1$ and $n_2$ independently represents an integer of 1 to 9, wherein $n_1+n_2$ is an integer of 3 to 10; and each of $m_1$ and $m_2$ independently represents an integer of 0 to 7, wherein $m_1+m_2$ is an integer of 0 to 7.

Examples of alkyl groups having 1 to 4 carbon atoms include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, and a 2-methyl-cyclopropyl group.

Examples of alkoxy groups having 1 to 4 carbon atoms include a methoxy group, ethoxy group, n-propoxy group, i-propoxy group, n-butoxy group, i-butoxy group, s-butoxy group, and t-butoxy group.

Examples of the "heterocyclic ring" include furan, pyrrole, pyran, imidazole, pyrazole, oxazole, thiophene, thiazole, thiadiazole, imidazolidine, thiazolidine, imidazoline, dioxane, morpholine, diazine, thiazine, triazole, tetrazole, dioxolane, pyridazine, pyrimidine, pyrazine, piperidine, piperazine, indole, purine, quinoline, isoquinoline, quinuclidine, chromene, thianthrene, phenothiazine, phenoxazine, xanthene, acridine, phenazine, carbazole and triazine.

The triazine may be a compound comprising triazineone, triazinedione, or triazinetrione; however, a compound comprising triazinetrione is preferred.

Examples of compounds having at least 3 or more carboxyl groups in the present application may include the following formulae (A-1) to (A-25), for example, but are not limited thereto.

[Chemical formula 4]

Formula (A-1)

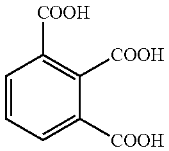

Formula (A-2)

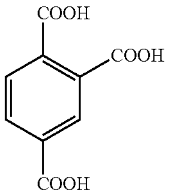

Formula (A-3)

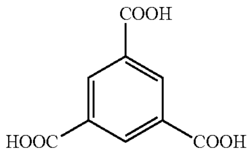

Formula (A-4)

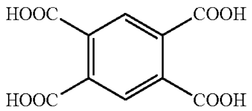

Formula (A-5)

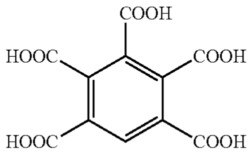

Formula (A-6)

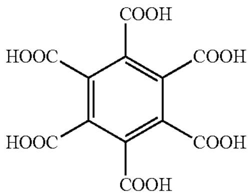

Formula (A-7)

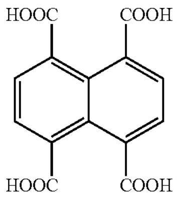

-continued

Formula (A-8)

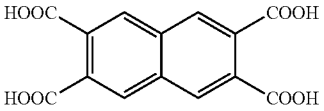

Formula (A-9)

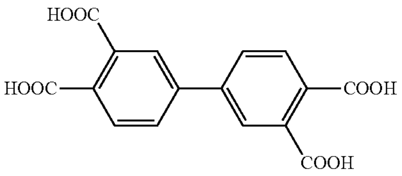

Formula (A-10)

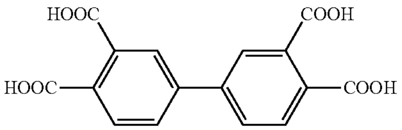

Formula (A-11)

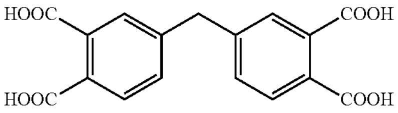

Formula (A-12)

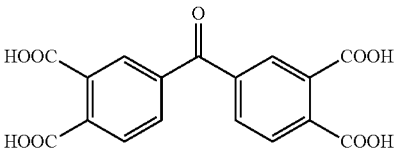

Formula (A-13)

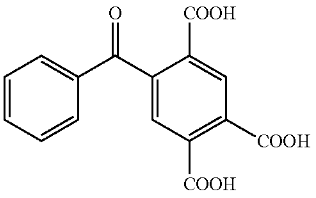

Formula (A-14)

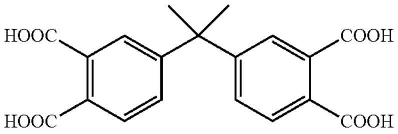

Formula (A-15)

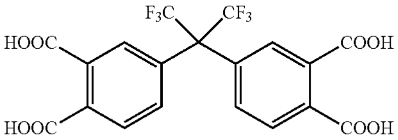

Formula (A-16)

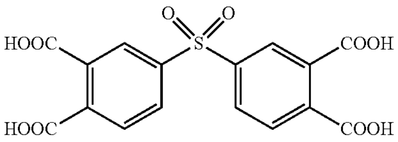

Formula (A-17)

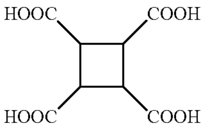

-continued

Formula (A-18)

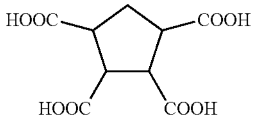

Formula (A-19)

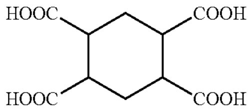

Formula (A-20)

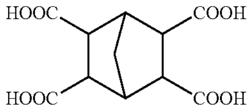

Formula (A-21)

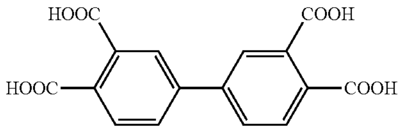

Formula (A-22)

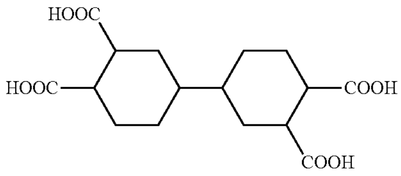

Formula (A-23)

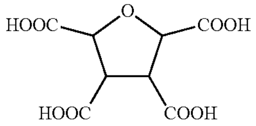

Formula (A-24)

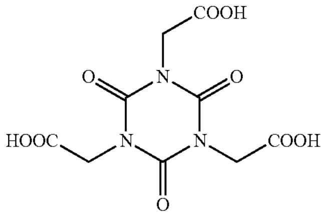

Formula (A-25)

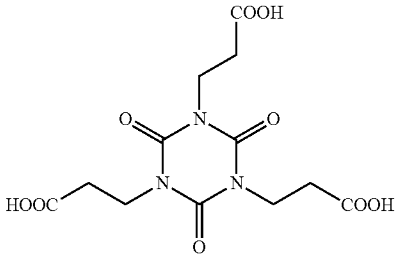

[Resin, Monomer]

The protective film forming composition of the present invention includes (B) a resin or monomer, as an essential component.

As the resin, a polymer with a weight average molecular weight of more than 1,000 (i.e., it can be 1,001 or more) may be used. Examples of the polymer include, without being particularly limited, polyester, polyether, polyether ether ketone, polyamide, polyimide, novolac resin, maleimide resin, acrylic resin and methacrylic resin. The upper limit of the weight average molecular weight of the polymer is, for example, 100,000 or 50,000.

Moreover, the resin preferably has at least one or more hydroxy group in its unit structure.

Examples of the resin having at least one or more hydroxy group in the unit structure may include, for example, a resin having a unit structure of the below-mentioned (2), which is a reaction product (B1) of a diepoxy compound (C) and a bi- or more functional proton generating compound (D).

The reaction product may include a unit structure represented by the following formula (2):

[Chemical formula 5]

Formula (2)

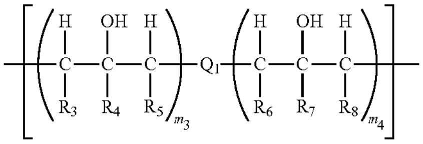

wherein: each of $R_3$, $R_4$, $R_5$, $R_6$, $R_7$ and $R_8$ independently represents a hydrogen atom, methyl group, or ethyl group; $Q_1$ represents a divalent organic group between two carbon atoms; and each of $m_3$ and $m_4$ independently represents 0 or 1.

$Q_1$ in formula (2) may be represented by the following formula (3):

[Chemical formula 6]

$$-Z_1-Q_2-Z_2- \quad (3)$$

wherein:

in formula (3), $Q_2$ represents a direct bond, or a divalent organic group having at least one alkylene group having 1 to 10 carbon atoms that may be interrupted by —O—, —S—, or —S—S—, an alkenylene group having 2 to 6 carbon atoms, an alicyclic hydrocarbon ring having 3 to 10 carbon atoms or an aromatic hydrocarbon ring having 6 to 14 carbon atoms; and the divalent organic group may be substituted with at least one group selected from the group consisting of an alkyl group having 1 to 6 carbon atoms, an alkenyl group having 2 to 6 carbon atoms, an alkynyl group having 2 to 6 carbon atoms, a halogen atom, a hydroxy group, a nitro group, a cyano group, a methylidene group, an alkoxy group having 1 to 6 carbon atoms, an alkoxycarbonyl group having 1 to 6 carbon atoms, and an alkylthio group having 1 to 6 carbon atoms. Each of $Z_1$ and $Z_2$ represents any of —COO—, —O—, and —S—.

$Q_1$ in formula (2) may be represented by the following formula (4):

[Chemical formula 7]

Formula (4)

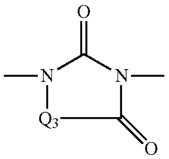

in formula (4), $Q_3$ represents the following formula (5), (6), or (7).

[Chemical formula 8]

Formula (5)

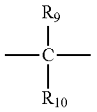

Formula (6)

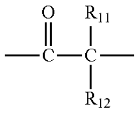

Formula (7)

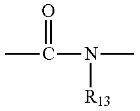

(wherein:

in formulae (5), (6), and (7), each of $R_9$, $R_{10}$, $R_{11}$, $R_{12}$ and $R_{13}$ independently represents a hydrogen atom, an alkyl group having 1 to 6 carbon atoms, an alkenyl group having 3 to 6 carbon atoms, a benzyl group, or a phenyl group; and the phenyl group may be substituted with at least one radical selected from the group consisting of an alkyl group having 1 to 6 carbon atoms, a halogen atom, a nitro group, a cyano group, an alkoxy group having 1 to 6 carbon atoms, and an alkylthio group having 1 to 6 carbon atoms; and $R_{11}$ and $R_{12}$ may bond to each other and may form a ring having 3 to 6 carbon atoms.

Examples of diepoxy compound (C) forming a structural unit represented by formula (2), in which $m_3$ and $m_4$ represent 1, include compounds having diglycidyl ether and diglycidyl ester having two epoxy groups represented by the following formulae (C-1) to (C-51), but are not limited to these examples.

[Chemical formula 9]

Formula (C-1)

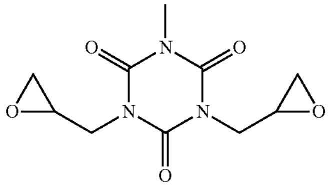

Formula (C-2)

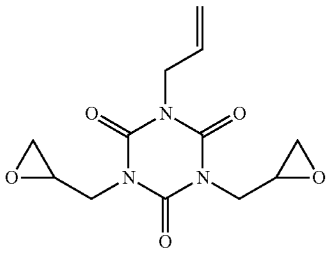

Formula (C-3)

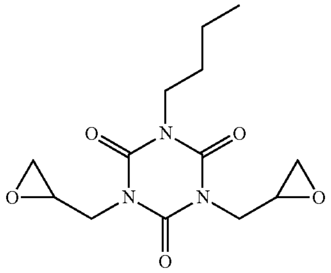

Formula (C-4)

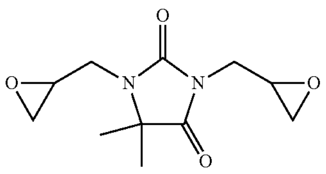

Formula (C-5)

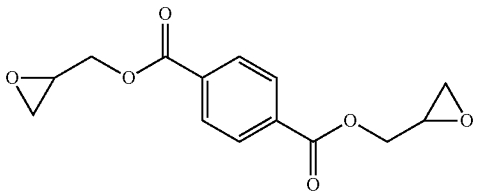

Formula (C-6)

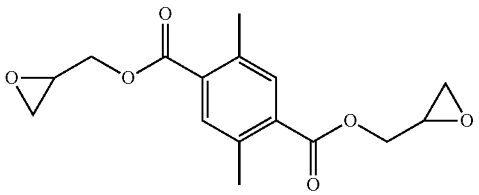

Formula (C-7)

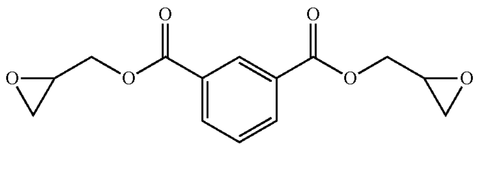

Formula (C-8)

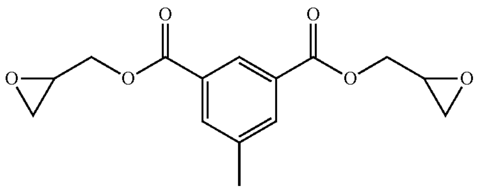

-continued
Formula (C-9)
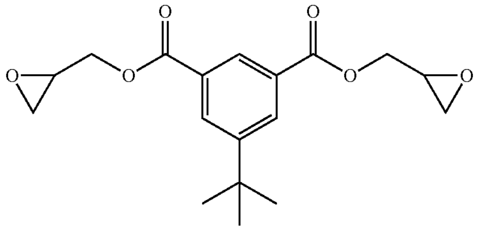
Formula (C-10)
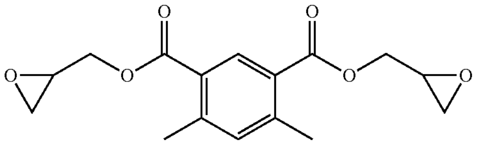
Formula (C-11)
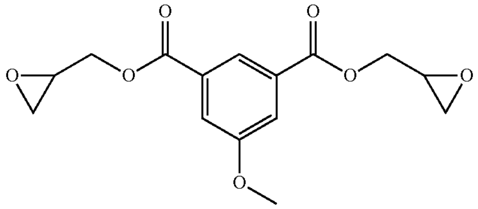
Formula (C-12)
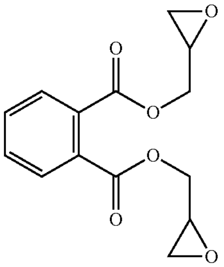
Formula (C-13)
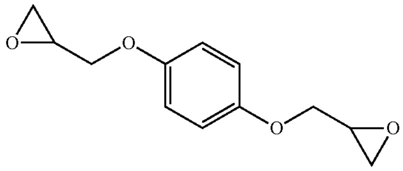
Formula (C-14)
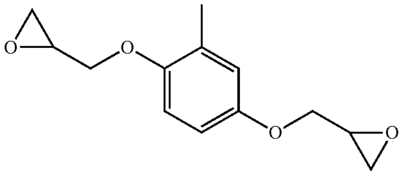
Formula (C-15)
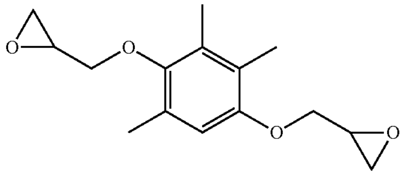
Formula (C-16)
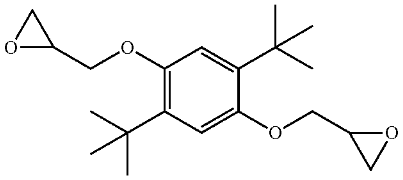
Formula (C-17)
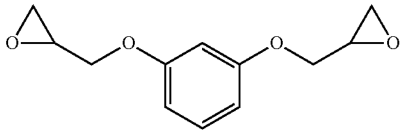
Formula (C-18)
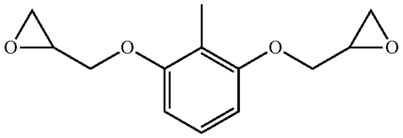
Formula (C-19)
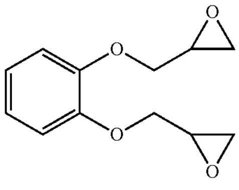
Formula (C-20)
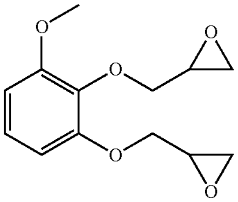
[Chemical formula 10]
Formula (C-21)
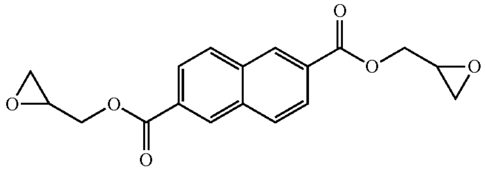
Formula (C-22)
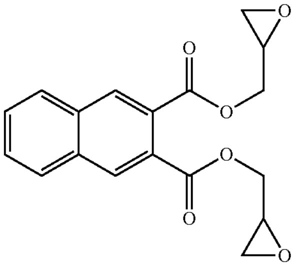

-continued
Formula (C-23)
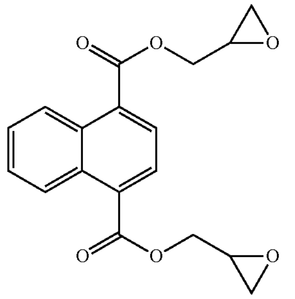
Formula (C-24)
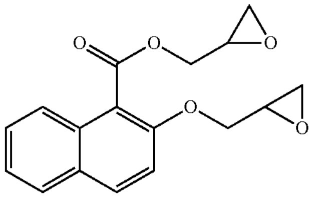
Formula (C-25)
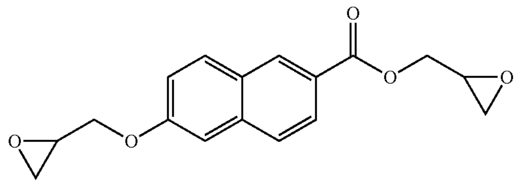
Formula (C-26)
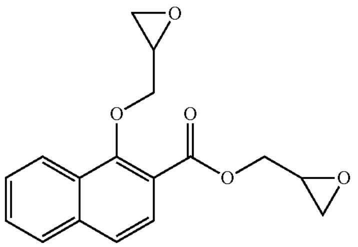
Formula (C-27)
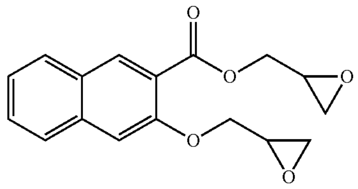
Formula (C-28)
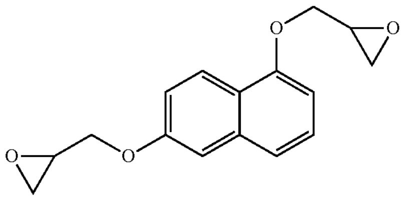
Formula (C-29)
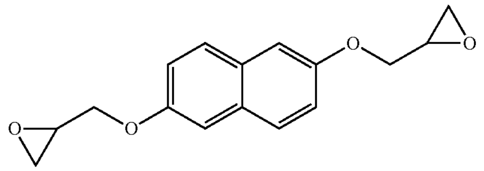
Formula (C-30)
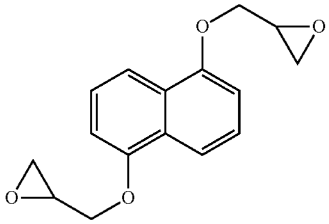
Formula (C-31)
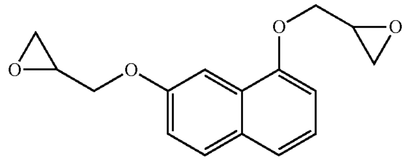
Formula (C-32)
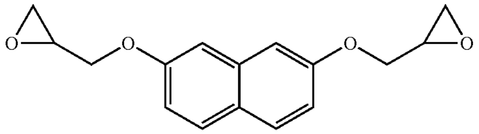
Formula (C-33)
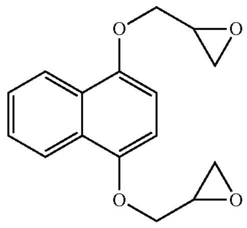
Formula (C-34)
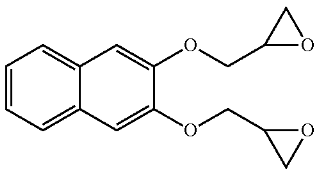

-continued
Formula (C-35)
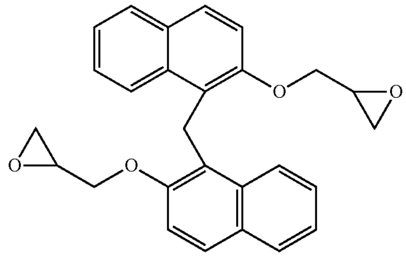
Formula (C-36)
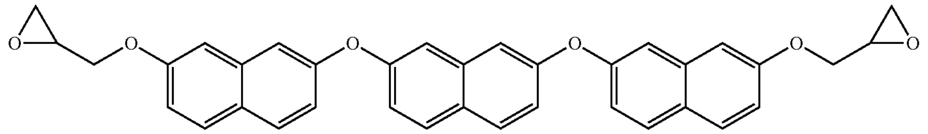
[Chemical formula 11]
Formula (C-37)
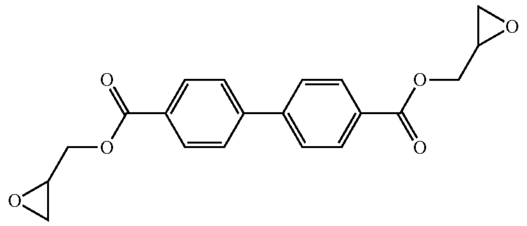
Formula (C-38)
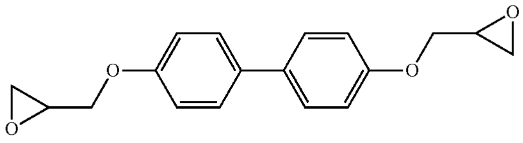
Formula (C-39)
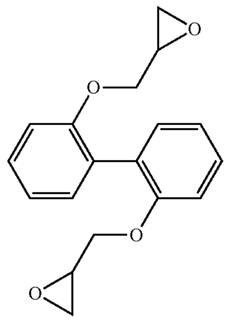
Formula (C-40)
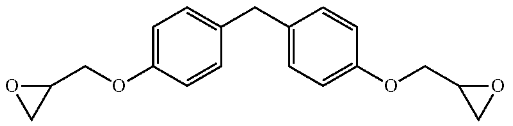
Formula (C-41)
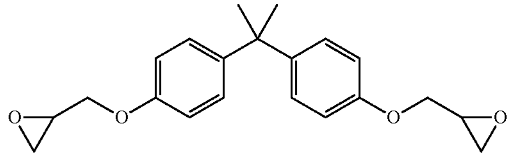
Formula (C-42)
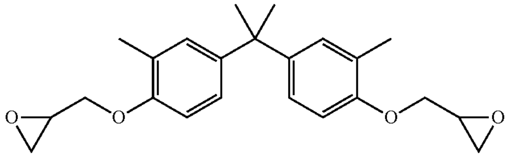
Formula (C-43)
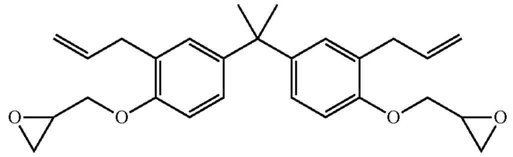
Formula (C-44)
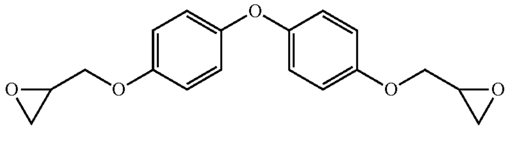

-continued

Formula (C-45)

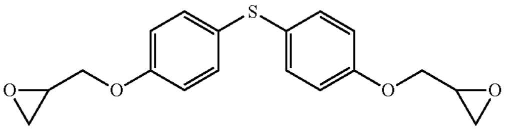

Formula (C-46)

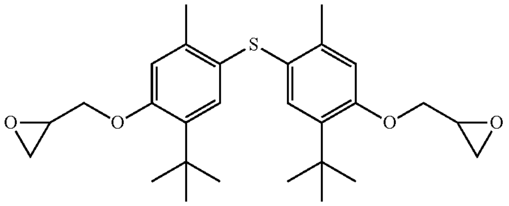

Formula (C-47)

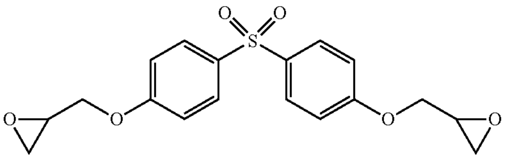

Formula (C-48)

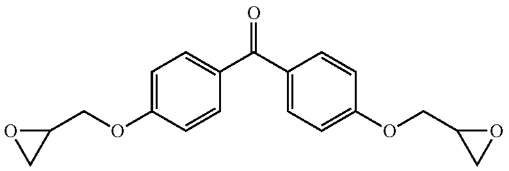

Formula (C-49)

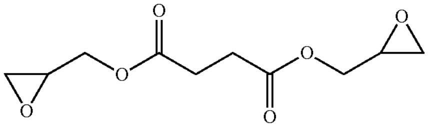

Formula (C-50)

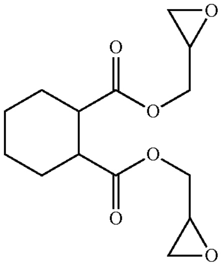

Formula (C-51)

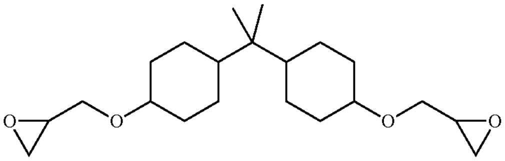

Examples of a bi- or more functional proton generating compound (D) forming a structural unit represented by formula (2), in which $m_3$ and $m_4$ represent 0, include compounds represented by the following formulae (D-1) to (D-47), which have two carboxyl groups, hydroxyphenyl groups, or imide groups, and acid dianhydrides, but are not limited to these examples.

[Chemical formula 12]

Formula (D-1)

HOOC—COOH

Formula (D-2)

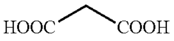

Formula (D-3)

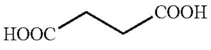

Formula (D-4)

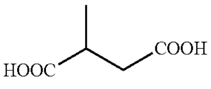

Formula (D-5)

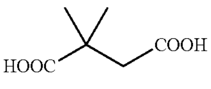

-continued

Formula (D-6)

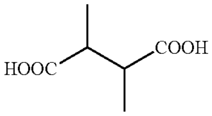

Formula (D-7)

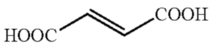

Formula (D-8)

Formula (D-9)

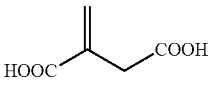

Formula (D-10)

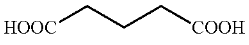

Formula (D-11)

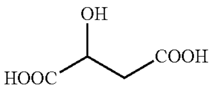

Formula (D-12)

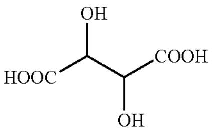

-continued
Formula (D-13)
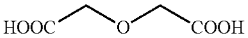
Formula (D-14)
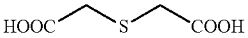
Formula (D-15)
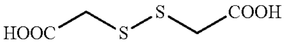
Formula (D-16)
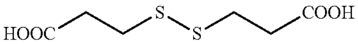
Formula (D-17)
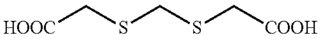
Formula (D-18)
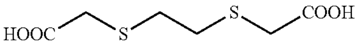
Formula (D-19)
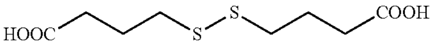
Formula (D-20)
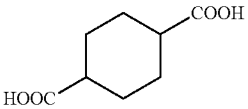
Formula (D-21)
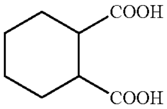
Formula (D-22)
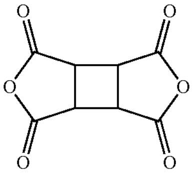
Formula (D-23)
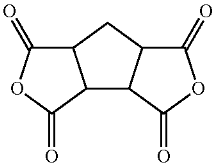
[Chemical formula 13]
Formula (D-24)
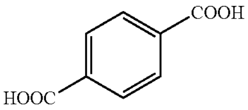
Formula (D-25)
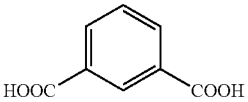
Formula (D-26)
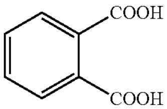
Formula (D-27)
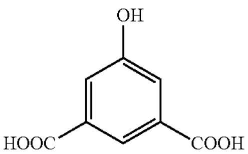
-continued
Formula (D-28)
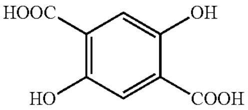
Formula (D-29)
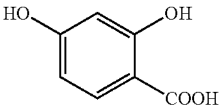
Formula (D-30)
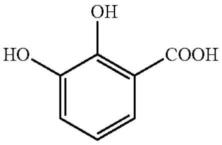
Formula (D-31)
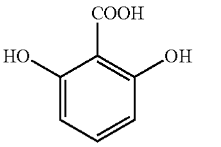
Formula (D-32)
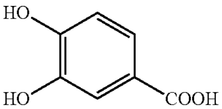
Formula (D-33)
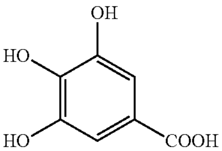
Formula (D-34)
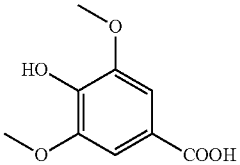
Formula (D-35)
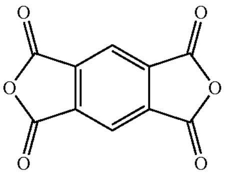
Formula (D-36)
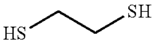
Formula (D-37)
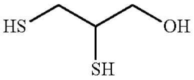
Formula (D-38)
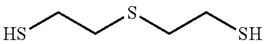
Formula (D-39)
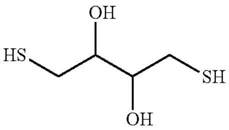

-continued
Formula (D-40)
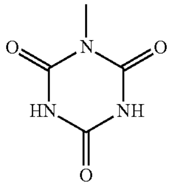
Formula (D-41)
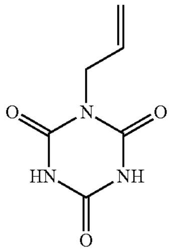
Formula (D-42)
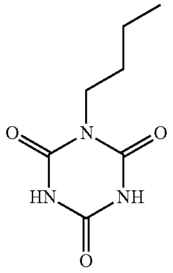
Formula (D-43)
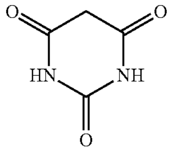
-continued
Formula (D-44)
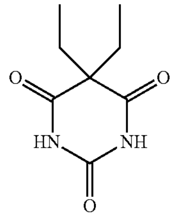
Formula (D-45)
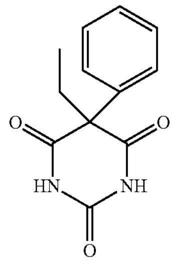
Formula (D-46)
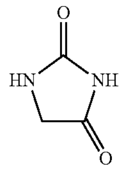
Formula (D-47)
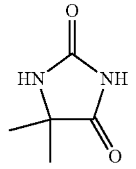
Examples of the unit structure of the reaction product (B1) of the diepoxy compound (C) and the bi- or more functional proton generating compound (D) include the following formulae (B1-1) to (B1-38), but are not limited to these examples.
[Chemical formula 14]
Formula (B1-1)
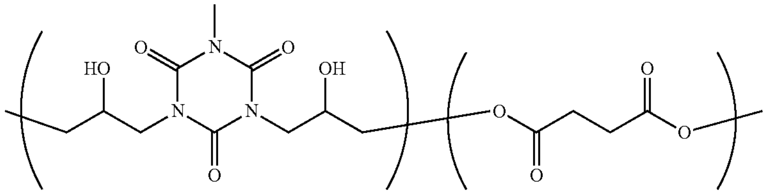
Formula (B1-2)
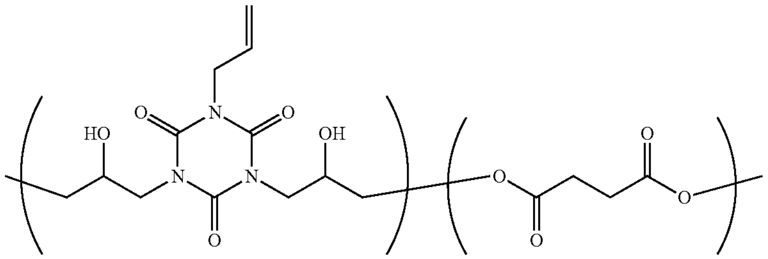

-continued
Formula (B1-3)
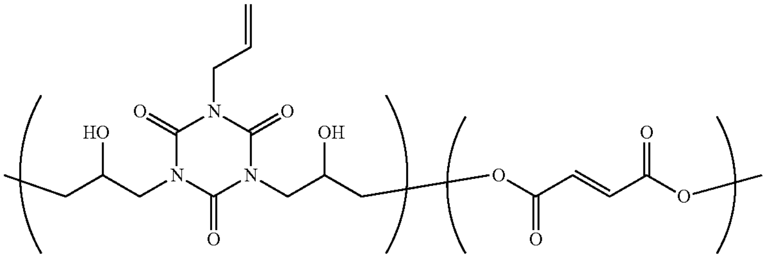
Formula (B1-4)
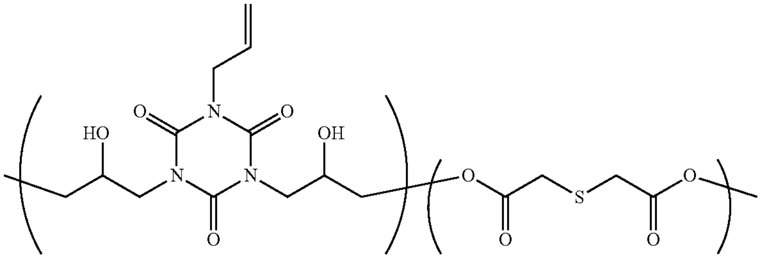
Formula (B1-5)
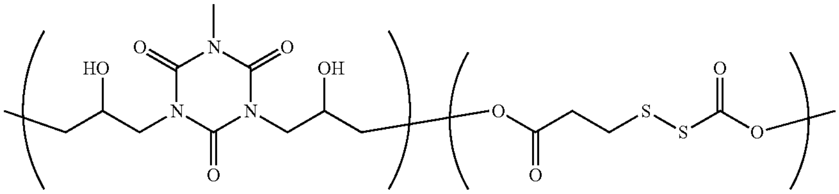
Formula (B1-6)
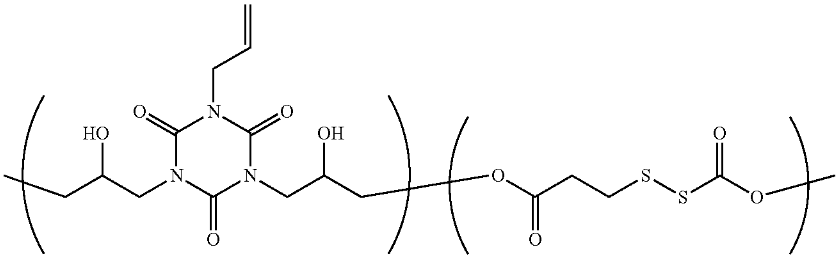
Formula (B1-7)
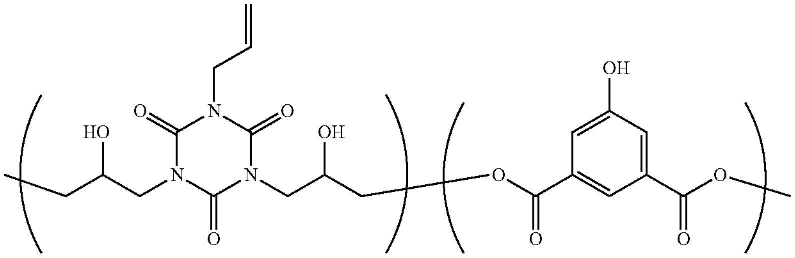
Formula (B1-8)
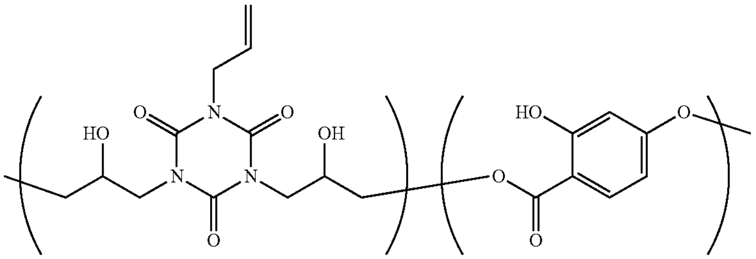

-continued
Formula (B1-9)
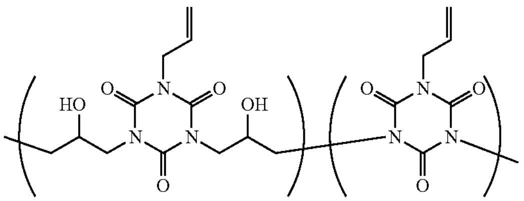
Formula (B1-10)
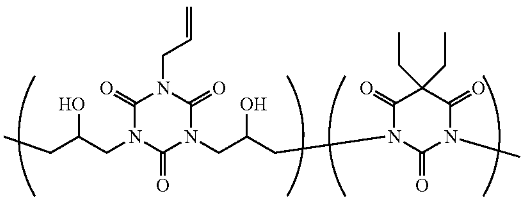
[Chemical formula 15]
Formula (B1-11)
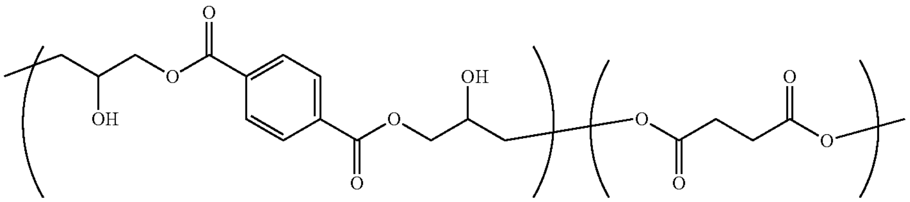
Formula (B1-12)
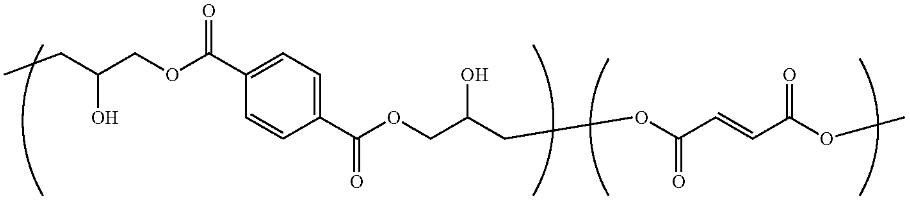
Formula (B1-13)
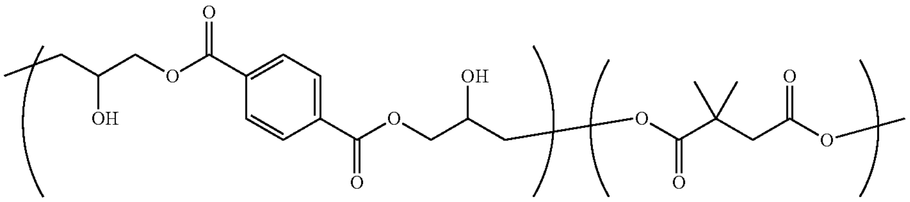
Formula (B1-14)
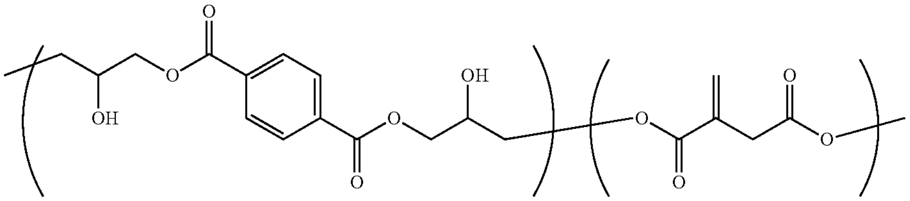
Formula (B1-15)
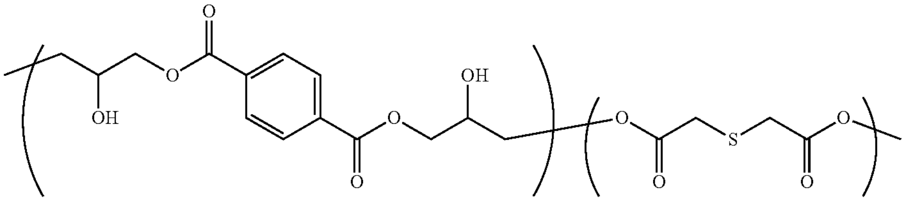
Formula (B1-16)
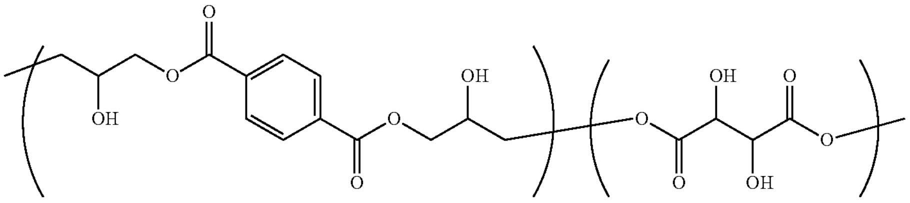

-continued
Formula (B1-17)
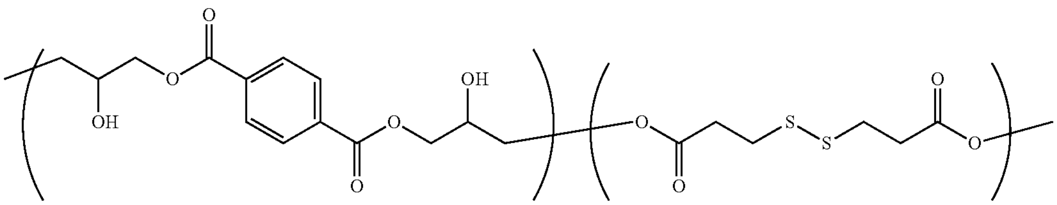
Formula (B1-18)
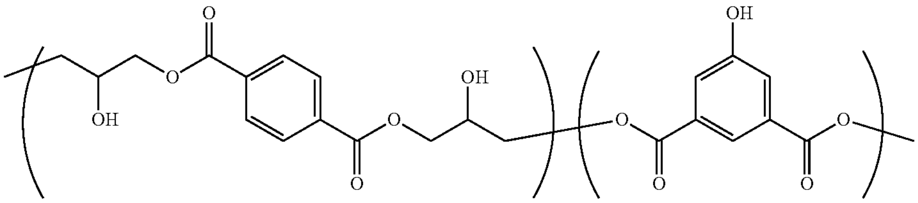
Formula (B1-19)
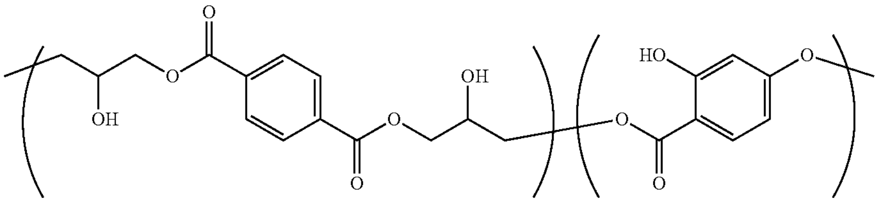
Formula (B1-20)
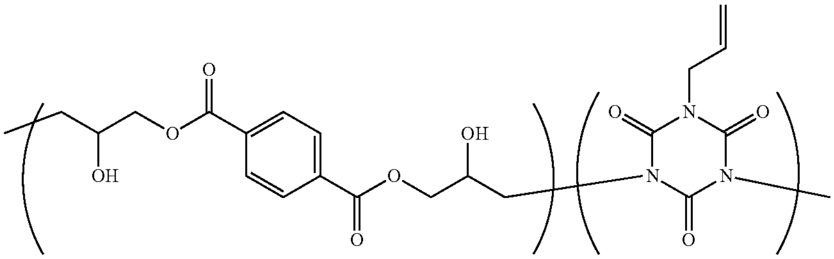
[Chemical formula 16]
Formula (B1-21)
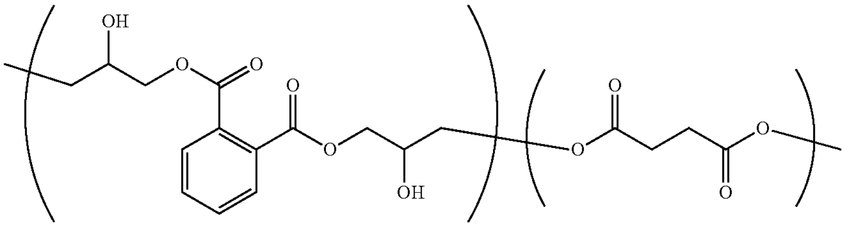
Formula (B1-22)
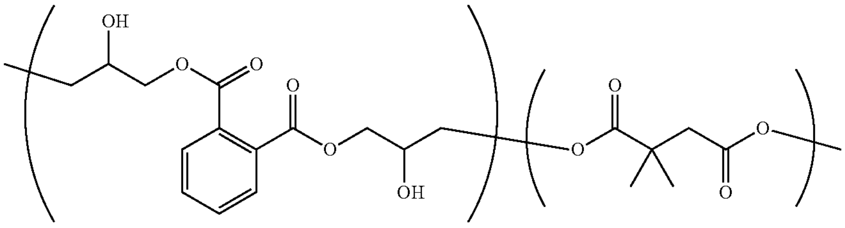

-continued
Formula (B1-23)
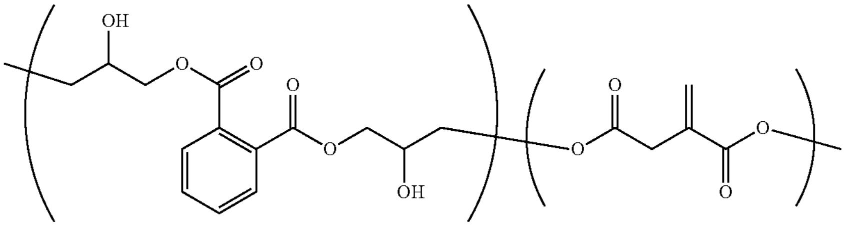
Formula (B1-24)
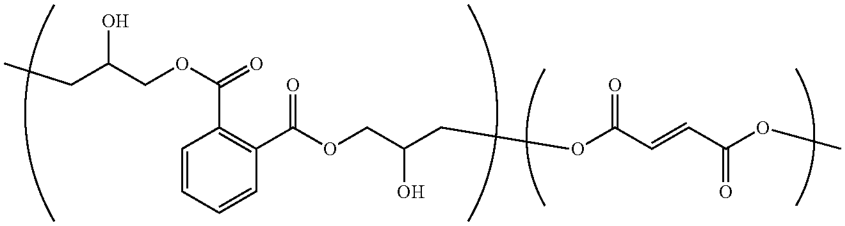
Formula (B1-25)
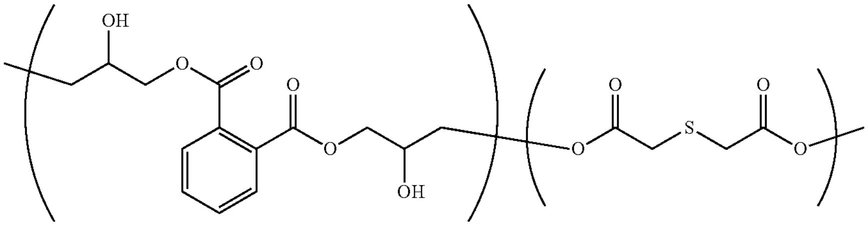
Formula (B1-26)
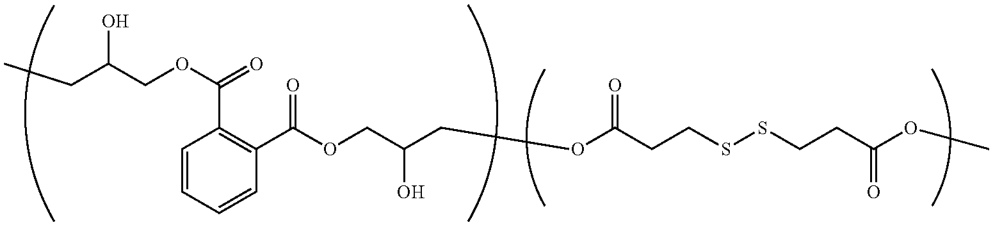
Formula (B1-27)
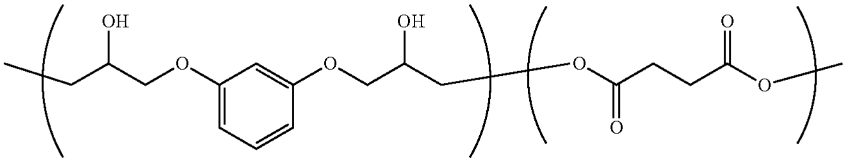
Formula (B1-28)
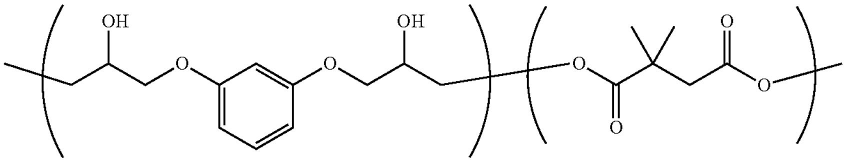
Formula (B1-29)
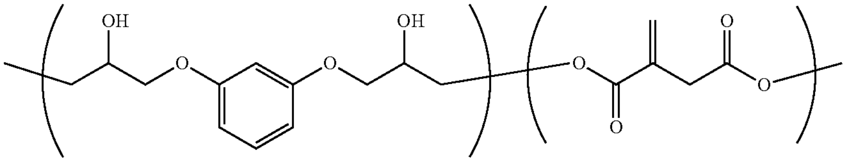
Formula (B1-30)
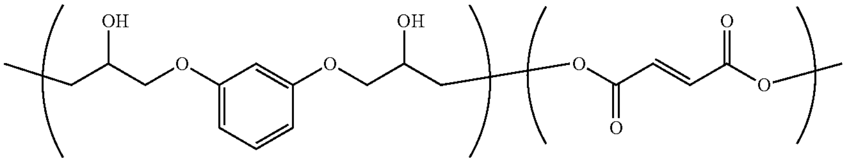

-continued
Formula (B1-31)
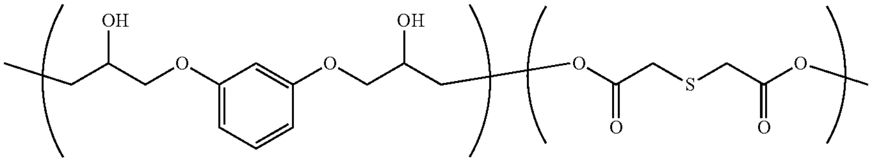
Formula (B1-32)
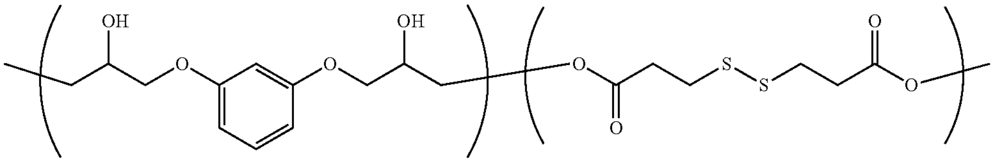
[Chemical formula 17]
Formula (B1-33)
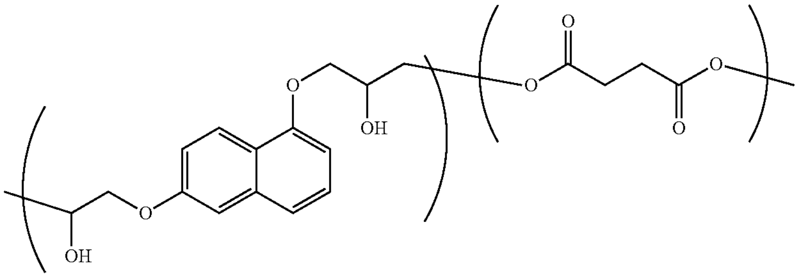
Formula (B1-34)
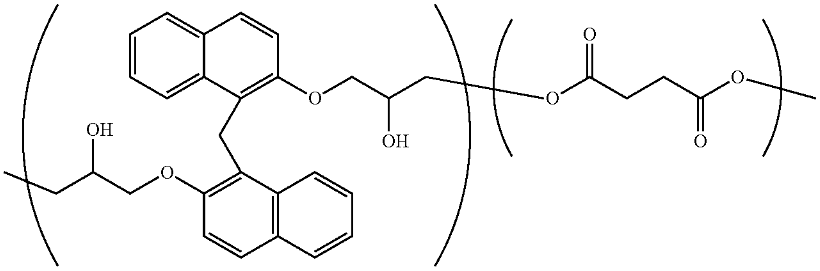
Formula (B1-35)
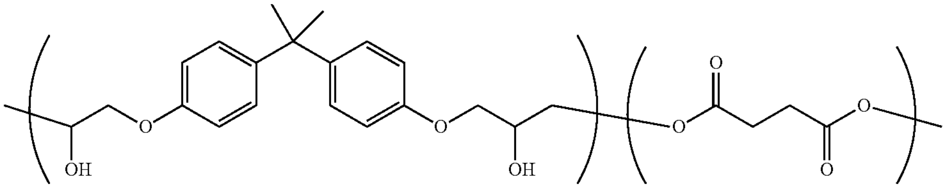
Formula (B1-36)
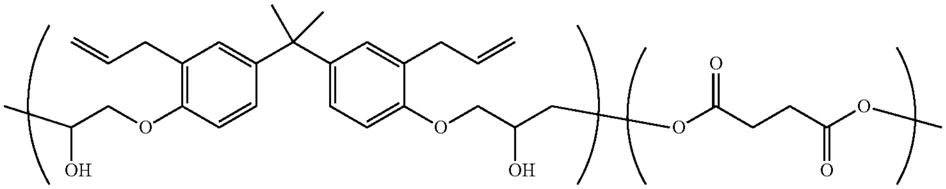
Formula (B1-37)
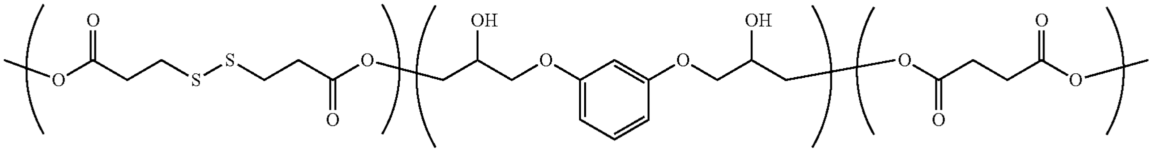

-continued

Formula (B1-38)

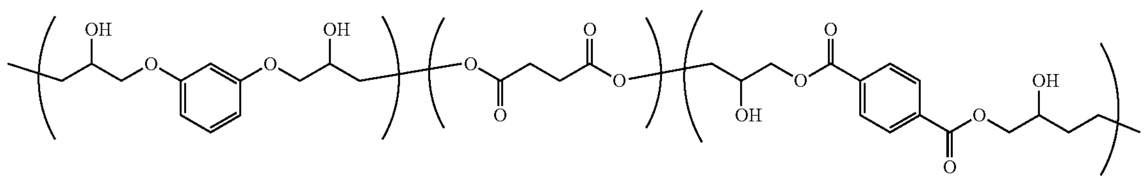

The resin having at least one hydroxy group in the unit structure may be a resin having, at a terminal, a structure containing at least one set of two hydroxy groups adjacent to each other in the molecule.

The structure containing at least one set of two hydroxyl groups adjacent to each other in the molecule may be a 1,2-ethanediol structure.

The 1,2-ethanediol structure may include a structure represented by the following formula (8):

[Chemical formula 18]

Formula (8)

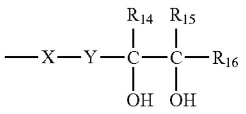

wherein:

in formula (8), X represents any of —COO—, —O—, —S—, or —$NR_{17}$— and $R_{17}$ represents a hydrogen atom or a methyl group. Y represents an alkylene group having 1 to 4 carbon atoms optionally being substituted. Each of $R_{14}$, $R_{15}$ and $R_{16}$ represents a hydrogen atom, or an alkyl group having 1 to 10 carbon atoms or an aryl group having 6 to 40 carbon atoms, each of the groups optionally being substituted, and $R_{14}$ may form a ring together with $R_{15}$ or $R_{16}$.

Specific examples of $R_{14}$ forming a ring together with $R_{15}$ or $R_{16}$ include cyclopentane, cyclohexane, and bicyclo[2,2,1]heptane.

In the case of forming a ring, the ring is induced by, for example, allowing a compound such as cyclopentane-1,2-diol, cyclohexane-1,2-diol, and bicyclo[2,2,1]heptane-1,2-diol, to react with a polymer end.

In formula (8), $R_{14}$, $R_{15}$ and $R_{16}$ may be a hydrogen atom.

In formula (8), Y may be a methylene group.

In formula (8), X may be —S—.

Examples of compounds that form the polymer end having a 1,2-ethanediol structure, for example, include compounds represented by the following formulae (E-1) to (E-4).

[Chemical formula 19]

Formula (E-1)

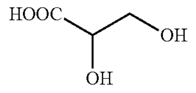

Formula (E-2)

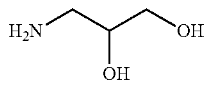

Formula (E-3)

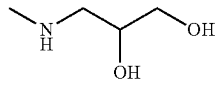

Formula (E-4)

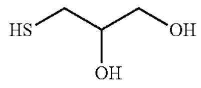

Furthermore, examples of structures that form the polymer end having a 1,2-ethanediol structure, for example, include compounds represented by the following formulae (B1-39) to (B1-50), but are not limited to these examples.

[Chemical formula 20]

Formula (B1-39)

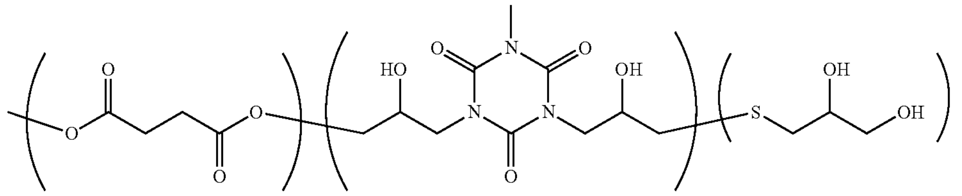

Formula (B1-40)

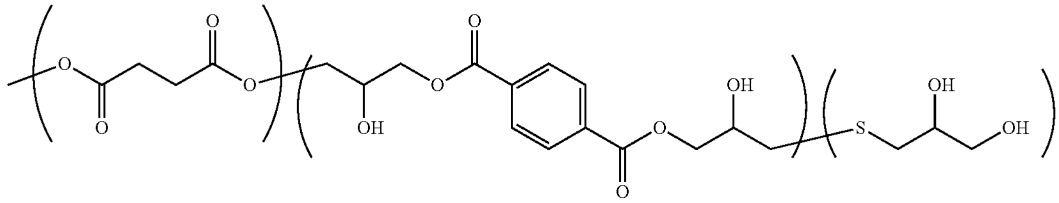

-continued
Formula (B1-41)
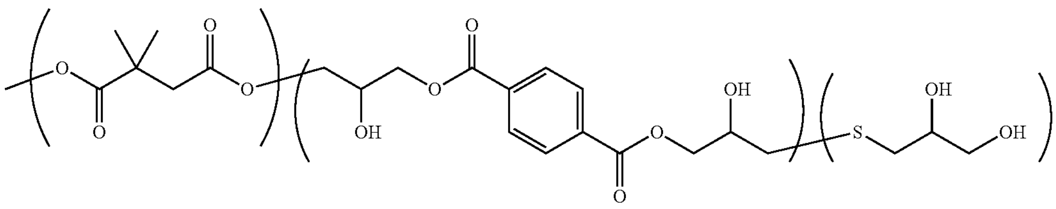
Formula (B1-42)
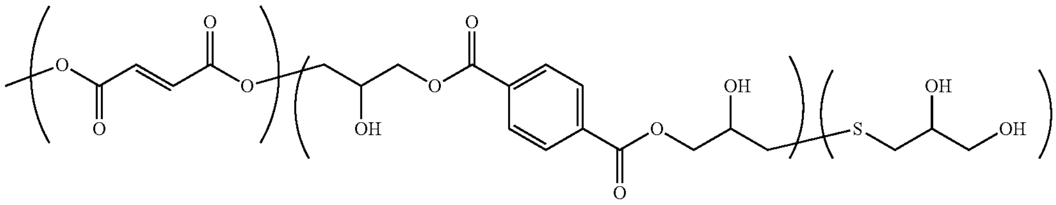
Formula (B1-43)
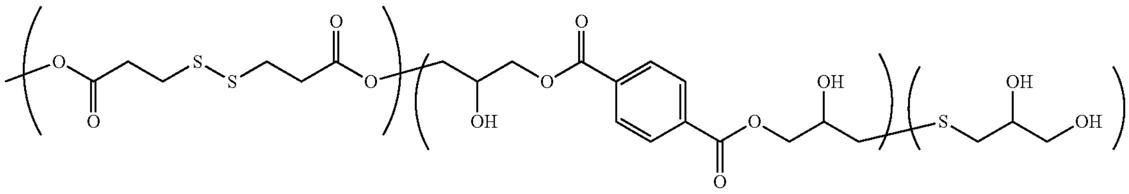
Formula (B1-44)
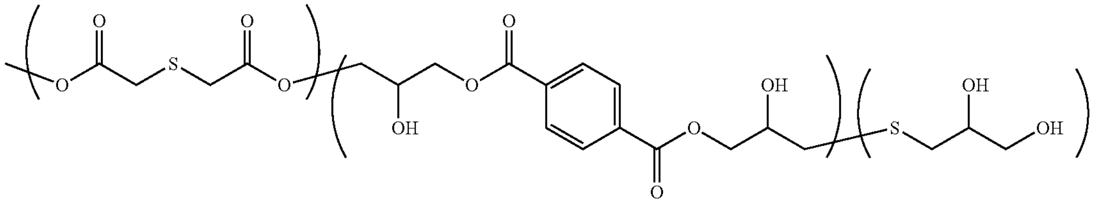
Formula (B1-45)
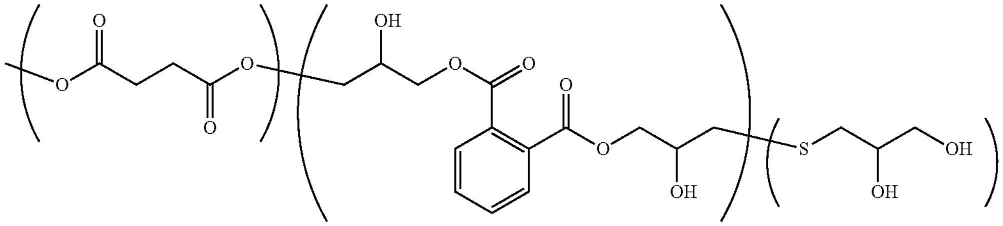
Formula (B1-46)
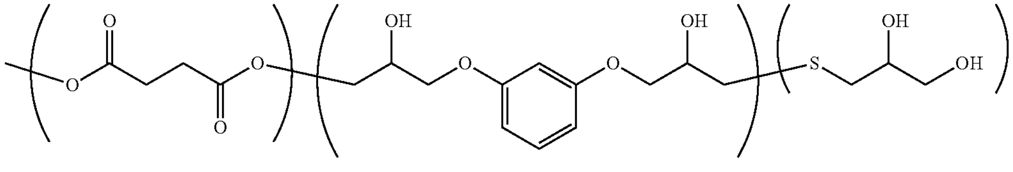
Formula (B1-47)
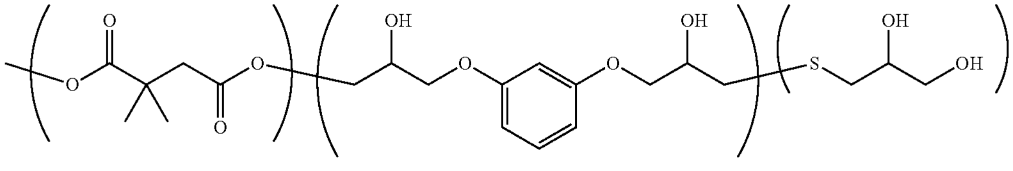

-continued

Formula (B1-48)

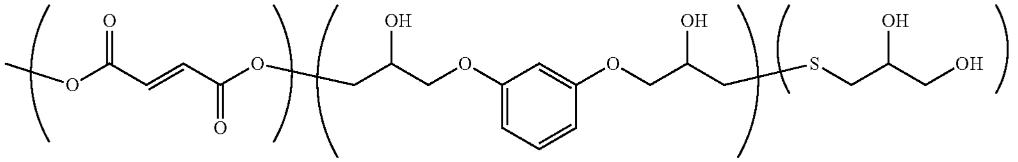

Formula (B1-49)

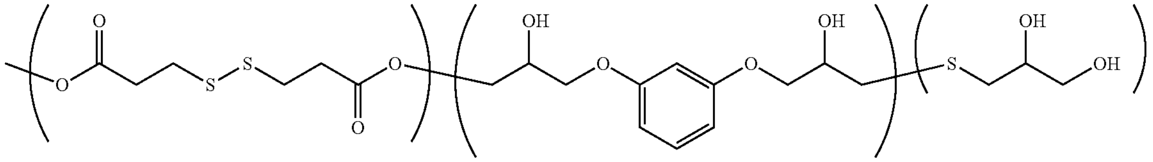

Formula (B1-50)

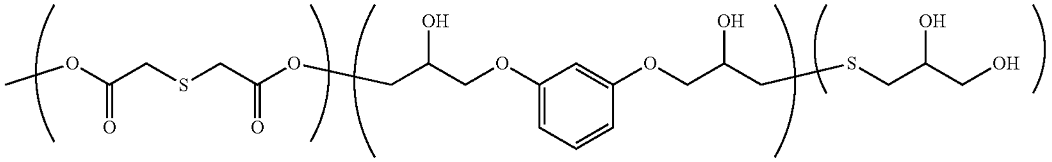

Monomers with a molecular weight of 1,000 or less can be used as the monomers. The molecular weight of the monomer is preferably within the range of 200 to 1,000 and more preferably 500 to 1,000.

Moreover, the monomer preferably has at least one hydroxy group in the molecule.

Examples of the monomer (B2) having at least one hydroxy group in the molecule may include the following formulae (B2-1) to (B2-8), but are not limited these examples.

Here, the monomer (B2) having at least one hydroxy group in the molecule, for example, can be obtained by the reaction of a polyfunctional epoxy compound with a proton generating compound.

[Chemical formula 21]

Formula (B2-1)

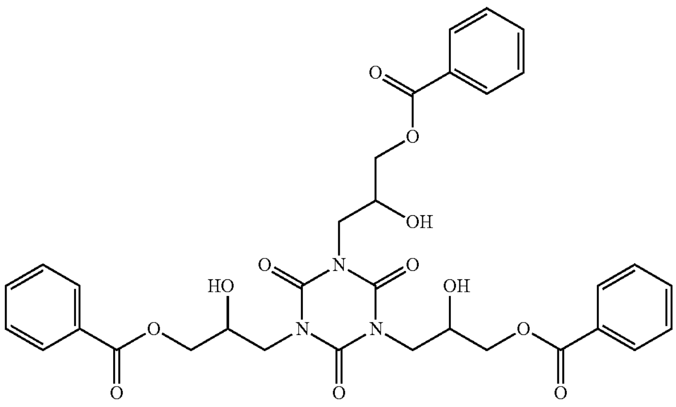

-continued
Formula (B2-2)
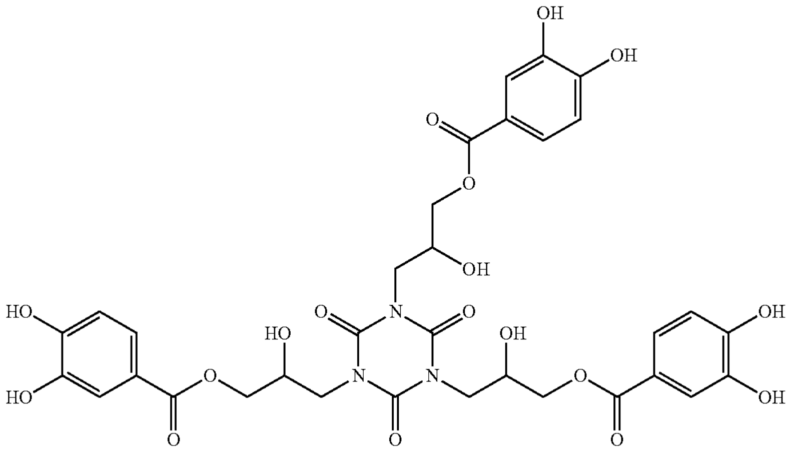
Formula (B2-3)
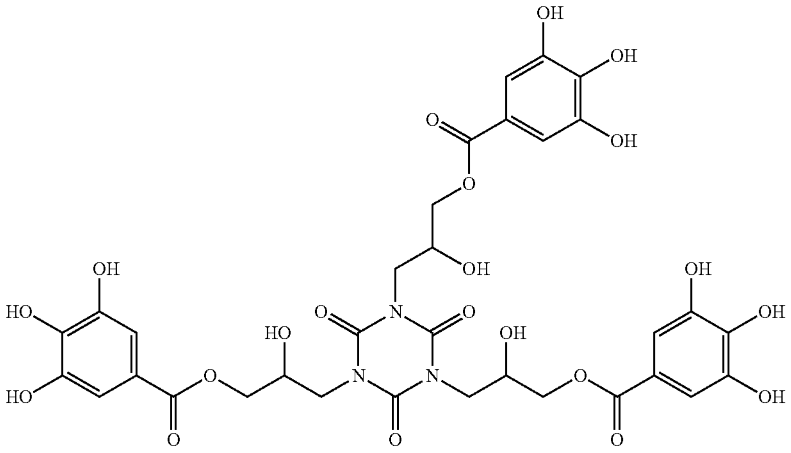
Formula (B2-4)
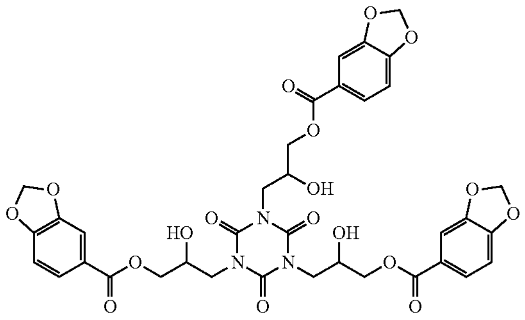
Formula (B2-5)
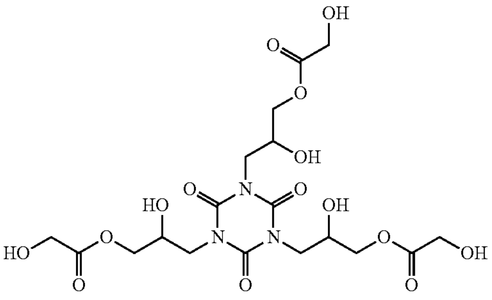
Formula (B2-6)
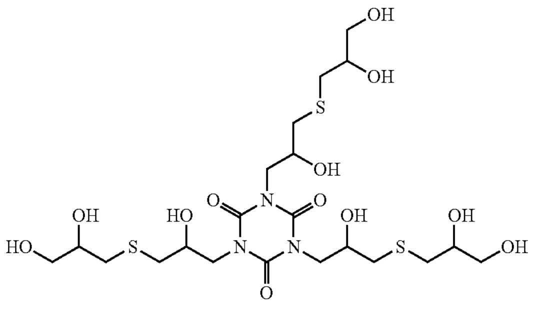

-continued

Formula (B2-7)

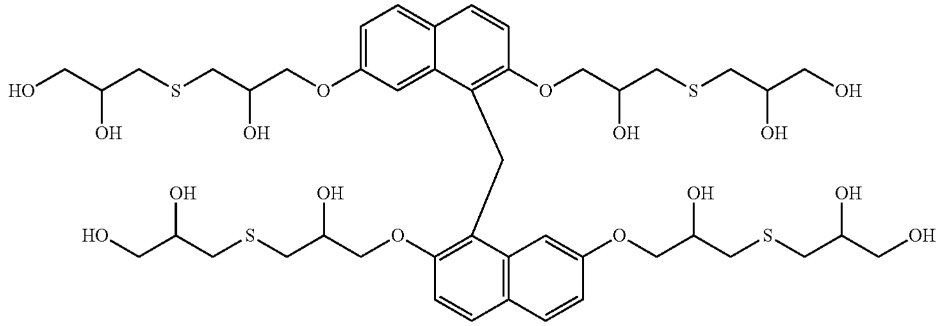

Formula (B2-8)

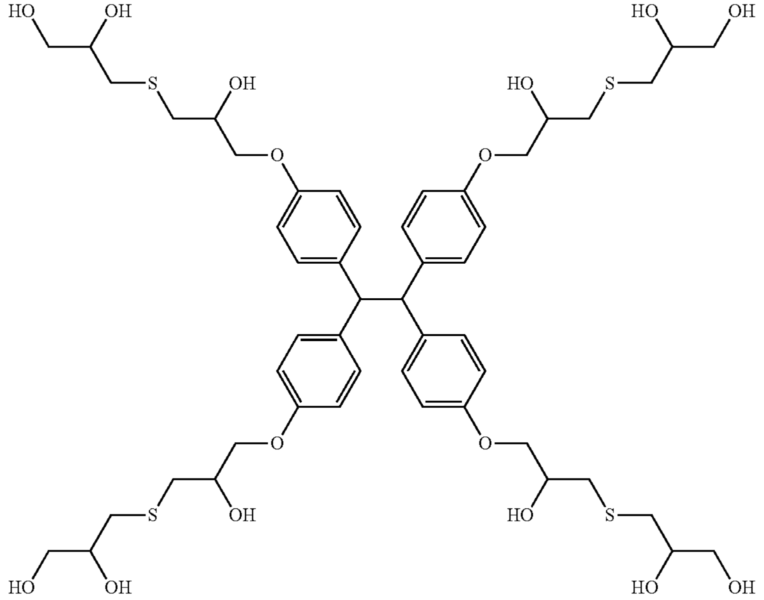

[Solvents]

The protective film forming composition of the present invention may be prepared by dissolving the above-mentioned components in an organic solvent, and the composition is used in a uniform solution state.

With respect to the solvent for the protective film forming composition of the present invention, there is no particular limitation as long as it is a solvent that can dissolve the (B) resin or monomer, and any of such solvents may be used. Particularly, the protective film forming composition of the present invention is used in a uniform solution state, and therefore, taking the application properties of the composition into consideration, it is recommended that a solvent generally used in a lithography process be used.

Examples of the organic solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, y-butyrolactone, N-methylpyrrolidone, N,N-dimethylformamide, and N,N-dimethylacetamide. These solvents may be used each alone or in combination of two or more.

Of these solvents, preferred are propylene glycol monomethyl ether, propylene glycol monomethyl ether acetate, ethyl lactate, butyl lactate, and cyclohexanone. Especially preferred are propylene glycol monomethyl ether and propylene glycol monomethyl ether acetate.

[Cross-Linking Agent]

The resist underlying film forming composition of the present invention may contain a cross-linking agent component. Examples of the cross-linking agents include those of melamine, substituted urea, or polymers of these. Preferred is a cross-linking agent having at least two cross-linking forming substituents, and examples include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Further, a condensation product of these compounds may be used.

As the cross-linking agent, a cross-linking agent having a high heat resistance may be used. With respect to the cross-linking agent having a high heat resistance, a compound containing in the molecule thereof, a cross-linking forming substituent having an aromatic ring (for example, a benzene ring or a naphthalene ring) may be used.

Examples of the compounds include compounds having a partial structure of formula (2-1) below, and polymers or oligomers having a repeating unit of formula (2-2) below.

[Chemical formula 22]

Formula (2-1)

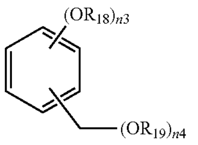

Formula (2-2)

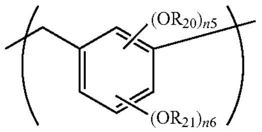

$R_{18}$, $R_{19}$, $R_{20}$, and $R_{21}$ are a hydrogen atom or an alkyl group having 1 to 10 carbon atoms, and those mentioned above as examples may be used as these alkyl groups.

$n_3$ satisfies $1 \le n_3 \le 6-n_4$, $n_4$ satisfies $1 \le n_4 \le 5$, $n_5$ satisfies $1 \le n_5 \le 4-n_6$, and $n_6$ satisfies $1 \le n_6 \le 3$.

The compound represented by formula (2-1) is exemplified by the following formulae (2-3) to (2-19).

[Chemical formula 23]

Formula (2-3)

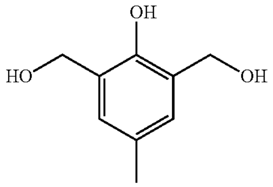

Formula (2-4)

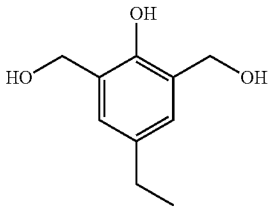

Formula (2-5)

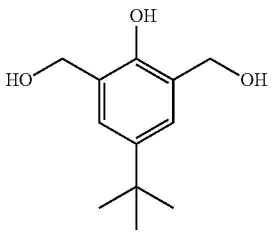

-continued

Formula (2-6)

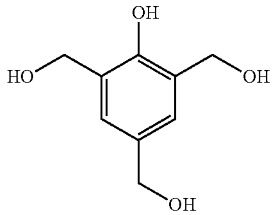

Formula (2-7)

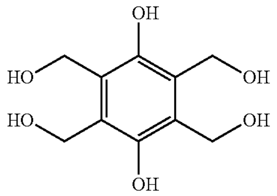

Formula (2-8)

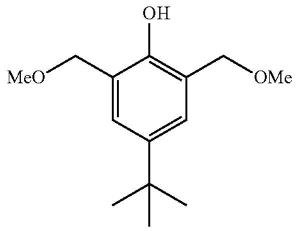

Formula (2-9)

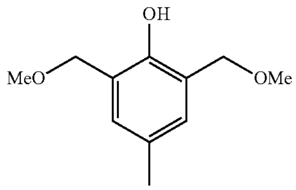

Formula (2-10)

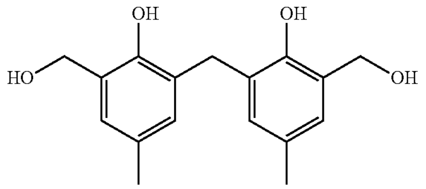

Formula (2-11)

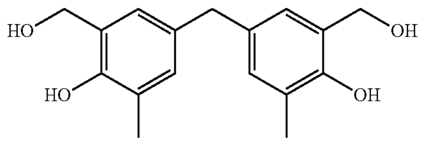

Formula (2-12)

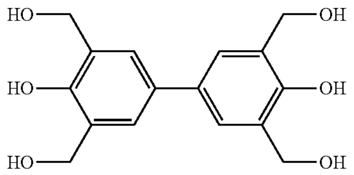

Formula (2-13)

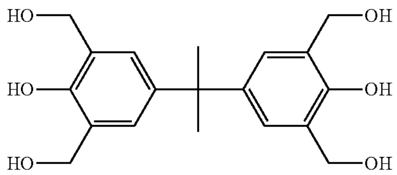

-continued

Formula (2-14)

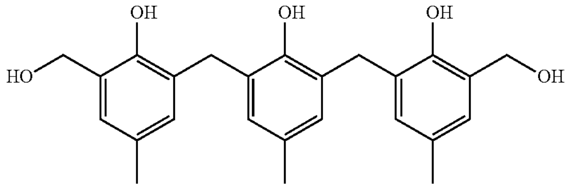

Formula (2-15)

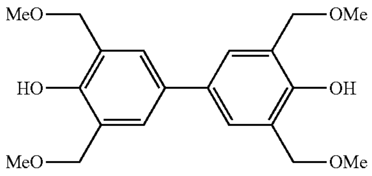

Formula (2-16)

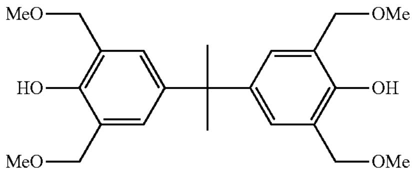

Formula (2-17)

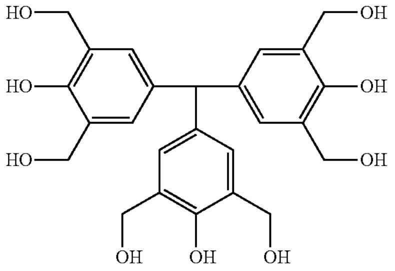

Formula (2-18)

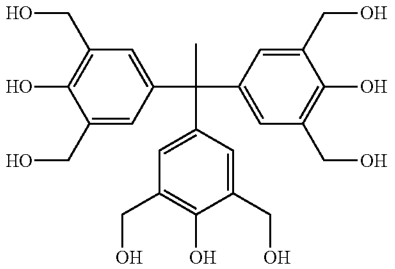

Formula (2-19)

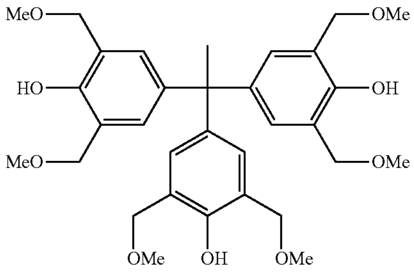

The above-mentioned compounds are available as products of Asahi Yukizai Corporation and Honshu Chemical Industry Co., Ltd. For example, of the above-mentioned cross-linking agents, the compound of formula (2-15) is available under the trade name: TMOM-BP, manufactured by Asahi Yukizai Corporation.

The amount of cross-linking agent added varies depending on the coating solvent used, the base substrate used, the required solution viscosity, the required film shape, and others. However, it is generally within the range of from 0.001 to 80% by mass, preferably from 0.01 to 50% by mass, and even more preferably from 0.1 to 40% by mass based on the total solid content of the protective film forming composition. These cross-linking agents may cause cross-linking reactions by self-condensation. However, if cross-linkable substituents are present in the above mentioned polymers of the present invention, the cross-linking agents can cause cross-linking reaction with those cross-linkable substituents.

[Cross-Linking Catalyst]

The protective film forming composition of the present invention may contain, as an optional component, a cross-linking catalyst for accelerating the cross-linking reaction. As the cross-linking catalyst, an acidic compound, a basic compound, or a compound capable of generating an acid or a base due to heat may be used, but a cross-linking acid catalyst is preferred. As the acidic compound, a sulfonic acid compound or a carboxylic acid compound may be used, and, as the compound capable of generating acid due to heat, a thermal acid generator may be used.

Examples of sulfonic acid compounds or carboxylic acid compounds include p-toluenesulfonic acid, trifluoromethanesulfonic acid, pyridinium trifluoromethanesulfonate, pyridinium p-toluenesulfonate, pyridinium-4-hydroxybenzenesulfonate, salicylic acid, camphorsulfonic acid, 5-sulfosalicylic acid, 4-chlorobenzenesulfonic acid, 4-phenolsulfonic acid, pyridinium-4-phenolsulfonate, benzenedisulfonic acid, 1-naphthalenesulfonic acid, 4-nitrobenzenesulfonic acid, citric acid, benzoic acid, and hydroxybenzoic acid.

Examples of thermal acid generators include K-PURE [registered trademark] CXC-1612, K-PURE CXC-1614, K-PURE TAG-2172, K-PURE TAG-2179, K-PURE TAG-2678, K-PURE TAG2689 (each of which is manufactured by King Industries, Inc.), and SI-45, SI-60, SI-80, SI-100, SI-110, SI-150 (each of which is manufactured by Sanshin Chemical Industry Co., Ltd.).

These cross-linking catalysts may be used each alone or in combination of two or more. Further, as the basic compound, an amine compound or an ammonium hydroxide compound may be used, and, as the compound capable of generating a base due to heat, urea may be used.

Examples of amine compounds include tertiary amines, such as triethanolamine, tributanolamine, trimethylamine, triethylamine, trinormalpropylamine, triisopropylamine, trinormalbutylamine, tri-tert-butylamine, trinormaloctylamine, triisopropanolamine, phenyldiethanolamine, stearyldiethanolamine, and diazabicyclooctane, and aromatic amines, such as pyridine and 4-dimethylaminopyridine. Further examples of amine compounds include primary amines, such as benzylamine and normalbutylamine, and secondary amines, such as diethylamine and dinormalbutylamine. These amine compounds may be used each alone or in combination of two or more.

Examples of ammonium hydroxide compounds include tetramethylammonium hydroxide, tetraethylammonium hydroxide, tetrapropylammonium hydroxide, tetrabutylammonium hydroxide, benzyltrimethylammonium hydroxide, benzyltriethylammonium hydroxide, cetyltrimethylammonium hydroxide, phenyltrimethylammonium hydroxide, and phenyltriethylammonium hydroxide.

As the compound capable of generating a base due to heat, for example, a compound having a thermally unstable group, such as an amide group, an urethane group, or an aziridine group, so that it generates an amine by heating it, may be used. Further examples of the compounds capable of generating a base due to heat include urea, benzyltrimethylammonium chloride, benzyltriethylammonium chloride, benzyldimethylphenylammonium chloride, benzyldodecyldimethylammonium chloride, benzyltributylammonium chloride, and choline chloride.

When the protective film forming composition contains a cross-linking catalyst, the amount of the cross-linking catalyst contained generally ranges from 0.0001 to 20% by mass, preferably from 0.01 to 15% by mass, further preferably from 0.1 to 10% by mass based on the total solid content of the protective film forming composition.

[Surfactant]

The protective film forming composition of the present invention may contain, as an optional component, a surfactant for improving the application properties with respect to a semiconductor substrate. Examples of the surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenyl ether and polyoxyethylene nonyl phenyl ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants, such as EFTOP [registered trademark] EF301, EFTOP EF303, EFTOP EF352 (manufactured by Mitsubishi Materials Electronic Chemicals Co., Ltd.), MEGAFACE [registered trademark] F171, MEGAFACE F173, MEGAFACE R-30, MEGAFACE R-40, MEGAFACE R-40-LM (manufactured by DIC Corporation), Fluorad FC430, Fluorad FC431 (manufactured by Sumitomo 3M), and AsahiGuard [registered trademark] AG710, Surflon [registered trademark] S-382, Surflon SC101, Surflon SC102, Surflon SC103, Surflon SC104, Surflon SC105, Surflon SC106 (manufactured by Asahi Glass Co., Ltd.), and organosiloxane polymer KP341 (manufactured by Shin-Etsu Chemical Co., Ltd.). These surfactants may be used each alone or in combination of two or more. When the protective film forming composition contains a surfactant, the amount of the surfactant contained generally ranges from 0.0001 to 10% by mass, preferably from 0.01 to 5% by mass to the total solid content of the protective film forming composition.

[Protective Film Forming Composition]

The protective film forming composition of the present invention generally has a solid content of from 0.1 to 70% by mass, preferably from 0.1 to 60% by mass. The solid content indicates a content ratio of the total component remaining after removing the solvent from the protective film forming composition. The ratio of the polymer in the solid content is preferably within the range of from 1 to 100% by mass, from 1 to 99.9% by mass, from 50 to 99.9% by mass, from 50 to 95% by mass, and from 50 to 90% by mass, while increasing preference.

[Method for Producing a Protective Film Against a Wet Etching Liquid for Semiconductor, a Substrate Having a Resist Pattern, and a Semiconductor Device]

Hereinbelow, a method for producing a substrate having a resist pattern and a method for producing a semiconductor device, using the protective film forming composition of the present invention, will be described.

The substrate having a resist pattern according to the present invention may be produced by applying the above-described protective film forming composition onto a semiconductor substrate and baking the applied composition.

Examples of semiconductor substrates to which the protective film forming composition of the present invention is applied include a silicon wafer, a germanium wafer, and compound semiconductor wafers, such as gallium arsenide, indium phosphide, gallium nitride, indium nitride, and aluminum nitride.

When a semiconductor substrate having an inorganic film formed on the surface thereof is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a silicon oxynitride film, a BPSG (Boro-Phospho Silicate Glass) film, a titanium nitride film, a titanium nitride oxide film, a tungsten nitride film, a gallium nitride film, and a gallium arsenide film.

The protective film forming composition of the present invention is applied onto the above-mentioned semiconductor substrate by an appropriate application method, such as a spinner or a coater. Then, the applied composition is baked using a heating means, such as a hotplate, to form a protective film. The conditions for baking are appropriately selected from those at a baking temperature from 100 to 400° C. for a baking time from 0.3 to 60 minutes. Preferred conditions for baking are those at a baking temperature from 120 to 350° C. for a baking time from 0.5 to 30 minutes, and more preferred conditions are those at a baking temperature from 150 to 300° C. for a baking time from 0.8 to 10 minutes. The thickness of the formed protective film ranges, for example, from 0.001 to 10 preferably from 0.002 to 1 more preferably from 0.005 to 0.5 When the temperature during the baking is lower than the above range, cross-linking sometimes unsatisfactorily proceeds, making it difficult to obtain a resistance of the formed protective film to a resist solvent or a basic aqueous hydrogen peroxide solution. To the contrary, when the temperature at baking stage is higher than the above range, the resultant protective film sometimes undergoes decomposition due to heat.

Exposure through a mask (reticle) for forming a predetermined pattern is conducted, and, for example, an i-line, a KrF excimer laser, an ArF excimer laser, an EUV (extreme ultraviolet light), or an EB (electron beam) is used. In development, an alkaline developer is used, and the conditions are appropriately selected from those at a development temperature from 5 to 50° C. for a development time from 10 to 300 seconds. A usable alkaline developer includes, for example, an aqueous solution of an alkali, e.g., an inorganic alkali, such as sodium hydroxide, potassium hydroxide, sodium carbonate, sodium silicate, sodium metasilicate, or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine. Further, the above-mentioned aqueous alkali solution to which an alcohol, such as isopropyl alcohol, or a surfactant, such as a nonionic surfactant, is added in an appropriate amount, may also be used. Of these, a preferred developer is quaternary ammonium salt, and further preferred are tetramethylammonium hydroxide and choline. Further, for example, a surfactant may be added to the above developer. A method in which development is conducted using an organic solvent, such as butyl acetate, instead of an alkaline developer, to develop a portion with an unimproved alkali dissolution rate of the photoresist, may be used.

Then, using the formed resist pattern as a mask, the protective film is subjected to dry etching. In this instance, when the above-mentioned inorganic film is formed on the surface of the semiconductor substrate used, the surface of the inorganic film is exposed, and, when the inorganic film is not formed on the surface of the semiconductor substrate used, the surface of the semiconductor substrate is exposed.

[A Wet Etching Liquid for Semiconductor]

Further, using the protective film obtained after dry etching (including the resist pattern in the case where the resist pattern remains on the protective film) as a mask, the resultant substrate is subjected to wet etching using a wet etching liquid for semiconductor, forming a desired pattern.

With respect to the wet etching liquid for semiconductor, a general chemical liquid for etching a wafer for semiconductor may be used, and, for example, both a substance exhibiting acidic property and a substance exhibiting basic property may be used.

Examples of substances exhibiting acidic property include hydrogen peroxide, hydrofluoric acid, ammonium fluoride, acidic ammonium fluoride, ammonium hydrogenfluoride, buffered hydrofluoric acid, hydrochloric acid, nitric acid, sulfuric acid, phosphoric acid, and a mixture thereof.

Examples of substances exhibiting basic property include a basic hydrogen peroxide solution obtained by mixing ammonia, sodium hydroxide, potassium hydroxide, sodium cyanide, potassium cyanide, or an organic amine, such as triethanolamine, with a hydrogen peroxide solution so that the pH of the resultant solution becomes basic. A specific example includes SC-1 (ammonia-hydrogen peroxide solution). In addition, the following could be used as a chemical liquid for wet etching: a mixture of a hydrogen peroxide solution and a substance that makes the pH to become basic, for example, urea, so that the heated mixture causes urea to undergo thermal decomposition, generating ammonia, resulting in the pH to eventually become basic.

Of these, preferred is an acidic hydrogen peroxide solution.

These chemical liquids may contain an additive, such as a surfactant.

The temperature at which the wet etching liquid for semiconductor is used ranges desirably from 25 to 90° C., further desirably from 40 to 80° C. The wet etching time ranges desirably from 0.5 to 30 minutes, further desirably from 1 to 20 minutes.

EXAMPLES

The following examples specifically illustrate the present invention in detail, but the present invention is not limited to these examples.

The apparatus and other conditions used in the measurement of the weight average molecular weight of the polymers obtained in the following synthesis examples are shown below.

Apparatus: HLC-8320GPC, manufactured by Tosoh Corp.

GPC Column: Shodex [registered trademark]-Asahipak [registered trademark] (Showa Denko K.K.)

Column temperature: 40° C.

Flow rate: 0.35 mL/minute

Eluent: tetrahydrofuran (THF)

Standard sample: Polystyrene (Tosoh Corp.)

Synthesis Example 1

67.55 g of propylene glycol monomethyl ether was added to 10.00 g of resorcinol diglycidyl ether (Product Name: Denacol EX-201-IM, manufactured by Nagase ChemteX Corporation), 6.09 g of succinic acid, and 0.80 g of ethyltriphenylphosphonium bromide, and the mixture in the reaction flask was heated while stirring for 27 hours at 100° C. under a nitrogen gas atmosphere. The obtained reaction product corresponds to formula (B1-27) and had a weight average molecular weight Mw of 3,000, as determined by polystyrene conversion by GPC.

[Chemical formula 24]

Formula (B1-27)

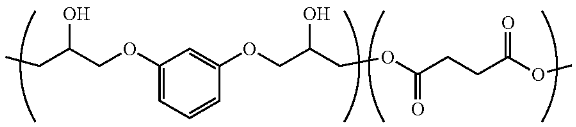

Synthesis Example 2

72.49 g of propylene glycol monomethyl ether was added to 25.00 g of resorcinol diglycidyl ether (Product Name: Denacol EX-201-IM, manufactured by Nagase ChemteX Corporation, 50.0% by weight propylene glycol monomethyl ether solution), 5.06 g of succinic acid, 2.32 g of 1-thioglycerol, and 1.36 g of tetrabutylphosphonium bromide, and the mixture in the reaction flask was heated while stirring for 21 hours at 100° C. under a nitrogen gas atmosphere. The obtained reaction product corresponds to formula (B1-46) and had a weight average molecular weight Mw of 3,300, as determined by polystyrene conversion by GPC.

[Chemical formula 25]

Formula (B1-46)

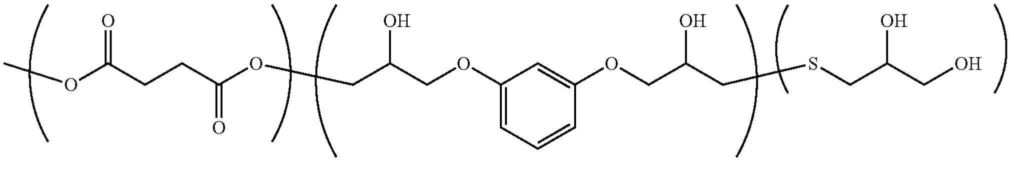

Trial Example 1

To 5.09 g of a solution of a reaction product corresponding to formula (B1-27) (solid content of 16.7% by weight) were added 0.03 g of pyridinium-trifluoromethanesulfonate as a cross-linking catalyst, and 0.001 g of fluorosurfactant (product name: MEGAFACE R-40, DIC corporation) as a surfactant, 0.03 g of pyromellitic acid represented by formula (A-4) as an additive, 12.95 g of propylene glycol monomethyl ether, and 1.91 g of propylene glycol monomethyl ether acetate, to prepare a solution of a protective film forming composition.

Trial Example 2

To 5.09 g of a solution of a reaction product corresponding to formula (B1-27) (solid content of 16.7% by weight) were added 0.03 g of pyridinium-trifluoromethanesulfonate as a cross-linking catalyst, 0.001 g of fluorosurfactant (product name: MEGAFACE R-40, DIC corporation) as a surfactant, 0.03 g of tetrahydrofuran-2,3,4,5-tetracarboxylic acid represented by formula (A-23) as an additive, 12.95 g of propylene glycol monomethyl ether, and 1.91 g of propylene glycol monomethyl ether acetate, to prepare a solution of a protective film forming composition.

Trial Example 3

To 5.23 g of a solution of a reaction product corresponding to formula (B1-46) (solid content of 16.2% by weight) were added 0.03 g of pyridinium-trifluoromethanesulfonate as a cross-linking catalyst, 0.001 g of fluorosurfactant (product name: MEGAFACE R-40, DIC corporation) as a surfactant, 0.03 g of pyromellitic acid represented by formula (A-4) as an additive, 12.81 g of propylene glycol monomethyl ether, and 1.91 g of propylene glycol monomethyl ether acetate, to prepare a solution of a protective film forming composition.

Trial Example 4

To 5.04 g of a solution of a reaction product corresponding to formula (B1-46) (solid content of 16.2% by weight) were added 0.04 g of pyridinium-trifluoromethanesulfonate as a cross-linking catalyst, 0.001 g of fluorosurfactant (product name: MEGAFACE R-40, DIC corporation) as a surfactant, 0.04 g of pyromellitic acid represented by formula (A-4) as an additive, 12.97 g of propylene glycol monomethyl ether, and 1.91 g of propylene glycol monomethyl ether acetate, to prepare a solution of a protective film forming composition.

Trial Example 5

To 4.44 g of a solution of a reaction product corresponding to formula (B1-46) (solid content of 16.2% by weight) were added 0.14 g of 3,3',5,5'-tetrakis(methoxymethyl)-4,4'-dihydroxybiphenyl (product name: TMOM-BP, manufactured by Honshu Chemical Industry Co., Ltd.) as a cross-linking agent, 0.01 g of pyridinium-4-hydroxybenzenesulfonate as a cross-linking catalyst, 0.001 g of fluorosurfactant (product name: MEGAFACE R-40, DIC corporation) as a surfactant, 0.02 g of pyromellitic acid represented by formula (A-4) as an additive, 13.47 g of propylene glycol monomethyl ether, and 1.91 g of propylene glycol monomethyl ether acetate, to prepare a solution of a protective film forming composition.

Trial Comparative Example 1

To 5.24 g of a solution of a reaction product corresponding to formula (B1-46) (solid content of 16.7% by weight) were added 0.03 g of pyridinium-trifluoromethanesulfonate as a cross-linking catalyst, 0.001 g of fluorosurfactant (product name: MEGAFACE R-40, DIC corporation) as a surfactant, 12.83 g of propylene glycol monomethyl ether, and 1.91 g of propylene glycol monomethyl ether acetate, to prepare a solution of a protective film forming composition.

Trial Comparative Example 2

To 5.09 g of a solution of a reaction product corresponding to formula (B1-46) (solid content of 16.7% by weight) were added 0.03 g of pyridinium-trifluoromethanesulfonate as a cross-linking catalyst, 0.001 g of fluorosurfactant (product name: MEGAFACE R-40, DIC corporation) as a surfactant, 0.03 g of gallic acid represented by the below-mentioned formula (F-1) as an additive, 12.95 g of propylene glycol monomethyl ether, and 1.91 g of propylene glycol monomethyl ether acetate, to prepare a solution of a protective film forming composition.

[Chemical formula 26]

Formula (F-1)

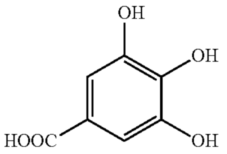

Trial Comparative Example 3

To 5.09 g of a solution of a reaction product corresponding to formula (B1-46) (solid content of 16.7% by weight) were added 0.03 g of pyridinium-trifluoromethanesulfonate as a cross-linking catalyst, 0.001 g of fluorosurfactant (product name: MEGAFACE R-40, DIC corporation) as a surfactant, 0.03 g of N-acetoacetyl anthranilic acid represented by the below-mentioned formula (F-2) as an additive, 12.95 g of propylene glycol monomethyl ether, and 1.91 g of propylene glycol monomethyl ether acetate, to prepare a solution of a protective film forming composition.

[Chemical formula 27]

Formula (F-2)

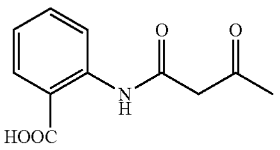

Trial Comparative Example 4

To 5.09 g of a solution of a reaction product corresponding to formula (B1-46) (solid content of 16.7% by weight) were added 0.03 g of pyridinium-trifluoromethanesulfonate as a cross-linking catalyst, 0.001 g of fluorosurfactant (product name: MEGAFACE R-40, DIC corporation) as a surfactant, 0.03 g of picolinic acid represented by the below-mentioned formula (F-3) as an additive, 12.95 g of propylene glycol monomethyl ether, and 1.91 g of propylene glycol monomethyl ether acetate, to prepare a solution of a protective film forming composition.

[Chemical formula 28]

Formula (F-3)

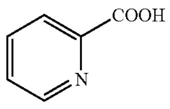

Trial Comparative Example 5

To 5.09 g of a solution of a reaction product corresponding to formula (B1-46) (solid content of 16.7% by weight) were added 0.03 g of pyridinium-trifluoromethanesulfonate as a cross-linking catalyst, 0.001 g of fluorosurfactant (product name: MEGAFACE R-40, DIC corporation) as a surfactant, 0.03 g of 2,6-pyridinedicarboxylic acid represented by the below-mentioned formula (F-4) as an additive, 12.95 g of propylene glycol monomethyl ether, and 1.91 g of propylene glycol monomethyl ether acetate, to prepare a solution of a protective film forming composition.

[Chemical formula 29]

Formula (F-4)

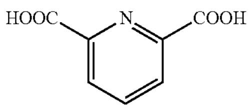

Trial Comparative Example 6

To 5.09 g of a solution of a reaction product corresponding to formula (B1-46) (solid content of 16.7% by weight) were added 0.03 g of pyridinium-trifluoromethanesulfonate as a cross-linking catalyst, 0.001 g of fluorosurfactant (product name: MEGAFACE R-40, DIC corporation) as a surfactant, 0.03 g of 2,3-pyrazinedicarboxylic acid represented by the below-mentioned formula (F-5) as an additive, 12.95 g of propylene glycol monomethyl ether, and 1.91 g of propylene glycol monomethyl ether acetate, to prepare a solution of a protective film forming composition.

[Chemical formula 30]

Formula (F-5)

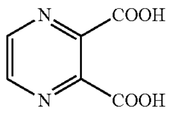

Trial Comparative Example 7

To 5.38 g of a solution of a reaction product corresponding to formula (B1-46) (solid content of 16.2% by weight) were added 0.03 g of pyridinium-trifluoromethanesulfonate as a cross-linking catalyst, 0.001 g of fluorosurfactant (product name: MEGAFACE R-40, DIC corporation) as a surfactant, 12.68 g of propylene glycol monomethyl ether, and 1.91 g of propylene glycol monomethyl ether acetate, to prepare a solution of a protective film forming composition.

Trial Comparative Example 8

To 5.23 g of a solution of a reaction product corresponding to formula (B1-46) (solid content of 16.2% by weight) were added 0.03 g of pyridinium-trifluoromethanesulfonate as a cross-linking catalyst, 0.001 g of fluorosurfactant (product name: MEGAFACE R-40, DIC corporation) as a surfactant, 0.03 g of gallic acid represented by formula (F-1) as an additive, 12.81 g of propylene glycol monomethyl ether, and 1.91 g of propylene glycol monomethyl ether acetate, to prepare a solution of a protective film forming composition.

Trial Comparative Example 9

To 5.28 g of a solution of a reaction product corresponding to formula (B1-46) (solid content of 16.2% by weight) were added 0.04 g of pyridinium-trifluoromethanesulfonate as a cross-linking catalyst, 0.001 g of fluorosurfactant (product name: MEGAFACE R-40, DIC corporation) as a surfactant, 12.77 g of propylene glycol monomethyl ether, and 1.91 g of propylene glycol monomethyl ether acetate, to prepare a solution of a protective film forming composition.

Trial Comparative Example 10

To 5.04 g of a solution of a reaction product corresponding to formula (B1-46) (solid content of 16.2% by weight) were added 0.04 g of pyridinium-trifluoromethanesulfonate as a cross-linking catalyst, 0.001 g of fluorosurfactant (product name: MEGAFACE R-40, DIC corporation) as a surfactant, 0.04 g of gallic acid represented by formula (F-1) as an additive, 12.97 g of propylene glycol monomethyl ether, and 1.91 g of propylene glycol monomethyl ether acetate, to prepare a solution of a protective film forming composition.

Trial Comparative Example 11

To 4.54 g of a solution of a reaction product corresponding to formula (B1-46) (solid content of 16.2% by weight) were added 0.15 g of 3,3',5,5'-tetrakis(methoxymethyl)-4,4'-dihydroxybiphenyl (product name: TMOM-BP, manufactured by Honshu Chemical Industry Co., Ltd.) as a cross-linking agent, 0.01 g of pyridinium-4-hydroxybenzenesulfonate as a cross-linking catalyst, 0.001 g of fluorosurfactant (product name: MEGAFACE R-40, DIC corporation) as a surfactant, 13.38 g of propylene glycol monomethyl ether, and 1.91 g of propylene glycol monomethyl ether acetate, to prepare a solution of a protective film forming composition.

Trial Comparative Example 12

To 4.44 g of a solution of a reaction product corresponding to formula (B1-46) (solid content of 16.2% by weight) were added 0.14 g of 3,3',5,5'-tetrakis(methoxymethyl)-4,4'-dihydroxybiphenyl (product name: TMOM-BP, manufactured by Honshu Chemical Industry Co., Ltd.) as a cross-linking agent, 0.01 g of pyridinium-4-hydroxybenzenesulfonate as a cross-linking catalyst, 0.001 g of fluorosurfactant (product name: MEGAFACE R-40, DIC corporation) as a surfactant, 0.02 g of gallic acid represented by formula (F-1) as an additive, 13.47 g of propylene glycol monomethyl ether, and 1.91 g of propylene glycol monomethyl ether acetate, to prepare a solution of a protective film forming composition.

[Test for Resistance to an Acidic Hydrogen Peroxide Solution]

The resistance to an acidic hydrogen peroxide solution was evaluated as follows: Each of the protective film forming compositions prepared in Trial Examples 1 to 5 and Comparative Examples 1 to 12, was applied to a 50 nm-thick TiN (Titanium Nitride) deposited substrate, 30 nm-thick TiN (Titanium Nitride) deposited substrate, 30 nm-thick TiON (titanium oxynitride) deposited substrate, or 30 nm-thick WN (tungsten nitride) deposited substrate, and heated at 250° C. for one minute to form a film having a thickness of 110 nm. The obtained protective film on each substrate was provided as Examples 1 to 7 and Comparative Examples 1 to 16. Details of each Example and each Comparative Example are provided in Table 1.

TABLE 1

| Example | Protective film forming composition | Substrate (Deposition film thickness) |
|---|---|---|
| Example 1 | Trial Example 1 | TiN (50 nm) |
| Example 2 | Trial Example 2 | TiN (50 nm) |
| Example 3 | Trial Example 3 | TiN (50 nm) |
| Example 4 | Trial Example 4 | TiON (30 nm) |
| Example 5 | Trial Example 4 | WN (30 nm) |
| Example 6 | Trial Example 5 | TiN (30 nm) |
| Example 7 | Trial Example 5 | TiON (30 nm) |
| Comparative Example 1 | Trial Comparative Example 1 | TiN (50 nm) |
| Comparative Example 2 | Trial Comparative Example 2 | TiN (50 nm) |
| Comparative Example 3 | Trial Comparative Example 3 | TiN (50 nm) |
| Comparative Example 4 | Trial Comparative Example 4 | TiN (50 nm) |
| Comparative Example 5 | Trial Comparative Example 5 | TiN (50 nm) |
| Comparative Example 6 | Trial Comparative Example 6 | TiN (50 nm) |
| Comparative Example 7 | Trial Comparative Example 7 | TiN (50 nm) |
| Comparative Example 8 | Trial Comparative Example 8 | TiN (50 nm) |
| Comparative Example 9 | Trial Comparative Example 9 | TiON (30 nm) |
| Comparative Example 10 | Trial Comparative Example 10 | TiON (30 nm) |
| Comparative Example 11 | Trial Comparative Example 9 | WN (30 nm) |
| Comparative Example 12 | Trial Comparative Example 10 | WN (30 nm) |
| Comparative Example 13 | Trial Comparative Example 11 | TiN (30 nm) |
| Comparative Example 14 | Trial Comparative Example 12 | TiN (30 nm) |
| Comparative Example 15 | Trial Comparative Example 11 | TiON (30 nm) |
| Comparative Example 16 | Trial Comparative Example 12 | TiON (30 nm) |

Thereafter, an acidic hydrogen peroxide solution was prepared by mixing 85% phosphoric acid and 30% hydrogen peroxide in a weight ratio of 1:1. Each of the deposited substrates applied with the protective film forming composition was immersed for a certain period of time in this acidic hydrogen peroxide solution heated at 60° C. After immersion, the substrate was washed, dried, and by visually checking the condition of the protective film, the period of time required for the protective film to peel off from the substrate was measured. The period of time required for the protective film to peel off partially or entirely from the substrate from the time immediately after the immersion of the substrate was defined as the "peeling off time of the protective film", which is shown in Tables [2-1] to [2-6]. Here, it is believed that the longer the peeling off time of the protective film becomes, the higher the resistance to wet etching liquid using acidic hydrogen peroxide solution becomes.

TABLE 2-1

| Example | Protective film forming composition | Substrate (Deposition film thickness) | Peeling off time of the protective film |
|---|---|---|---|
| Example 1 | Trial Example 1 | TiN (50 nm) | 5-10 minutes |
| Example 2 | Trial Example 2 | TiN (50 nm) | 5-10 minutes |
| Comparative Example 2 | Trial Comparative Example 2 | TiN (50 nm) | 5 minutes or less |
| Comparative Example 3 | Trial Comparative Example 3 | TiN (50 nm) | 5 minutes or less |
| Comparative Example 4 | Trial Comparative Example 4 | TiN (50 nm) | 5 minutes or less |
| Comparative Example 5 | Trial Comparative Example 5 | TiN (50 nm) | 5 minutes or less |
| Comparative Example 6 | Trial Comparative Example 6 | TiN (50 nm) | 5 minutes or less |

TABLE 2-2

| Example | Protective film forming composition | Substrate (Deposition film thickness) | Peeling off time of the protective film |
|---|---|---|---|
| Example 3 | Trial Example 3 | TiN (50 nm) | 15 minutes or more |
| Comparative Example 7 | Trial Comparative Example 7 | TiN (50 nm) | 5-10 minutes |
| Comparative Example 8 | Trial Comparative Example 8 | TiN (50 nm) | 5-10 minutes |

TABLE 2-3

| Example | Protective film forming composition | Substrate (Deposition film thickness) | Peeling off time of the protective film |
|---|---|---|---|
| Example 4 | Trial Example 4 | TiON (30 nm) | 15 minutes or more |
| Comparative Example 9 | Trial Comparative Example 9 | TiON (30 nm) | 10-15 minutes |
| Comparative Example 10 | Trial Comparative Example 10 | TiON (30 nm) | 10-15 minutes |

TABLE 2-4

| Example | Protective film forming composition | Substrate (Deposition film thickness) | Peeling off time of the protective film |
|---|---|---|---|
| Example 5 | Trial Example 4 | WN (30 nm) | 5-10 minutes |
| Comparative Example 11 | Trial Comparative Example 9 | WN (30 nm) | 3 minutes or less |
| Comparative Example 12 | Trial Comparative Example 10 | WN (30 nm) | 3-5 minutes |

TABLE 2-5

| Example | Protective film forming composition | Substrate (Deposition film thickness) | Peeling off time of the protective film |
|---|---|---|---|
| Example 6 | Trial Example 5 | TiN (30 nm) | 15 minutes or more |
| Comparative Example 13 | Trial Comparative Example 11 | TiN (30 nm) | 5 minutes or less |
| Comparative Example 14 | Trial Comparative Example 12 | TiN (30 nm) | 10-15 minutes |

TABLE 2-6

| Example | Protective film forming composition | Substrate (Deposition film thickness) | Peeling off time of the protective film |
|---|---|---|---|
| Example 7 | Trial Example 5 | TiON (30 nm) | 10-15 minutes |
| Comparative Example 15 | Trial Comparative Example 11 | TiON (30 nm) | 5 minutes or less |
| Comparative Example 16 | Trial Comparative Example 12 | TiON (30 nm) | 5-10 minutes |

Based on the above results, in each of Tables [2-1] to [2-6], despite of the difference in the kind of deposited substrate, the protective film forming compositions of Examples showed a longer peeling off time of the protective film to an acidic hydrogen peroxide solution than those of the Comparative Examples in each Table. In other words, the protective film forming compositions containing a polyvalent carboxylic acid disclosed in the present invention as an additive would demonstrate a better resistance to a wet etching liquid using an acidic hydrogen peroxide solution than the protective film forming compositions not containing the polyvalent carboxylic acid according to the present invention. Thus, the protective film forming composition containing the polyvalent carboxylic acid as an additive is useful for making a protective film against a wet etching liquid for semiconductor.

INDUSTRIAL APPLICABILITY

The protective film forming composition of the present invention provides a protective film with excellent resistance when wet etching liquid is applied in processing a substrate and with high dry etching rate, which facilitates substrate processing and demonstrates excellent flattening effect when applied to a stepped substrate.

The invention claimed is:

1. A protective film forming composition against a wet etching liquid for semiconductor comprising:

(A) a compound comprising at least 4 carboxyl groups, wherein the compound comprising at least 4 carboxyl groups (A) is at least one selected from the group consisting of the following formulae (A-4) to (A-12) and (A-14) to (A-23);

Formula (A-4)

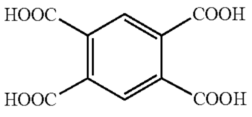

-continued

Formula (A-5)

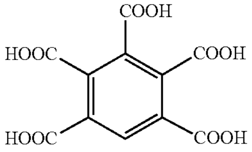

Formula (A-6)

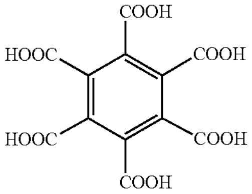

Formula (A-7)

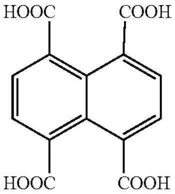

Formula (A-8)

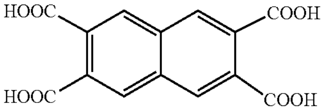

Formula (A-9)

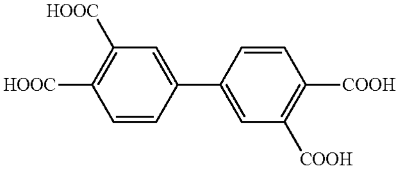

Formula (A-10)

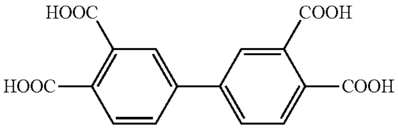

Formula (A-11)

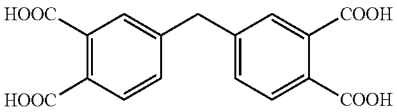

Formula (A-12)

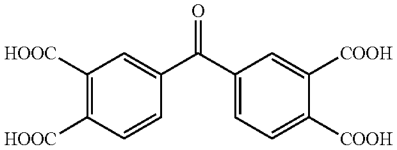

Formula (A-14)

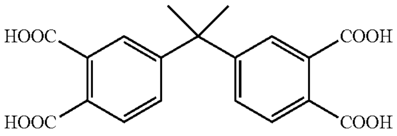

Formula (A-15)

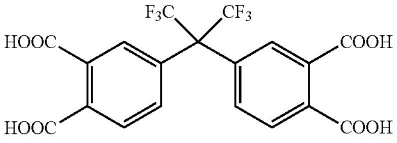

-continued

Formula (A-16)

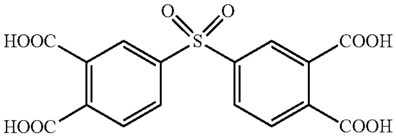

Formula (A-17)

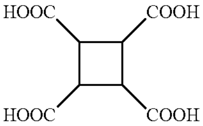

Formula (A-18)

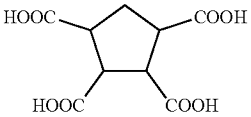

Formula (A-19)

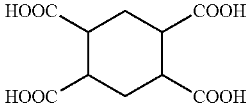

Formula (A-20)

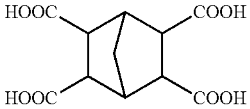

Formula (A-21)

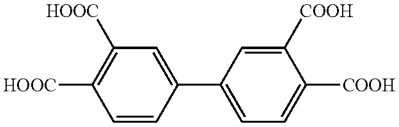

Formula (A-22)

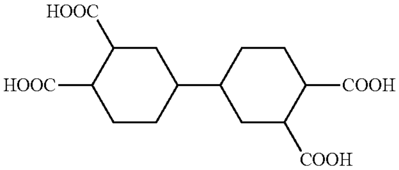

and

Formula (A-23)

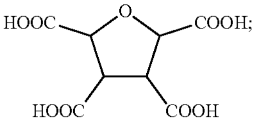

;

(B) a resin or monomer; and a solvent.

2. The protective film forming composition against a wet etching liquid for semiconductor according to claim 1, wherein the resin or monomer (B) has at least one hydroxy group in a unit structure of the resin or in the molecule of the monomer.

3. The protective film forming composition against a wet etching liquid for semiconductor according to claim 1, further comprising at least one member selected from the group consisting of cross-linking agent, cross-linking catalyst, and surfactant.

4. The protective film forming composition against a wet etching liquid for semiconductor according to claim 1, wherein the wet etching liquid for semiconductor comprises a hydrogen peroxide solution.

5. A protective film against a wet etching liquid for semiconductor, which is a baked product of an applied film of the protective film forming composition according to claim 1.

6. A method for producing a substrate having a resist pattern comprising the steps of:

applying the protective film forming composition according to claim 1 onto a semiconductor substrate and baking the applied composition to form a protective film as a resist underlying film, forming a resist film on the protective film, and then forming a resist pattern by exposure and development, wherein the substrate having a resist pattern is for manufacturing a semiconductor.

7. A method for producing a semiconductor device comprising the steps of:

forming a protective film on a semiconductor substrate optionally having an inorganic film formed on a surface thereof using the protective film forming composition according to claim 1;

forming a resist pattern on the protective film;

subjecting the protective film to dry etching using the resist pattern as a mask so as to expose a surface of the inorganic film or the semiconductor substrate; and while using the dry-etched protective film as a mask, subjecting the inorganic film or the semiconductor substrate to wet etching and/or to washing using a wet etching liquid for semiconductor.

8. A protective film forming composition against a wet etching liquid for semiconductor comprising:

(A) a compound comprising at least 3 carboxyl groups, wherein the compound comprising at least 3 carboxyl groups (A) is at least one selected from the group consisting of the following formulae (A-1) to (A-25);

Formula (A-1)

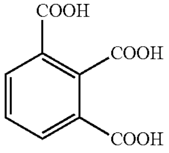

Formula (A-2)

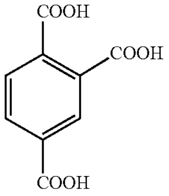

Formula (A-3)

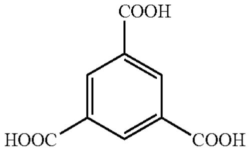

Formula (A-4)

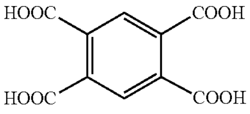

Formula (A-5)

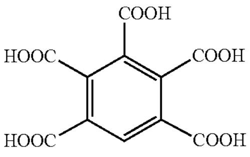

-continued

Formula (A-6)

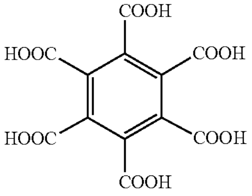

Formula (A-7)

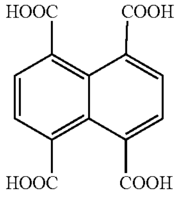

Formula (A-8)

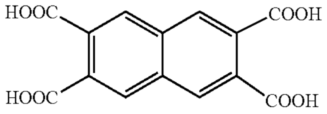

Formula (A-9)

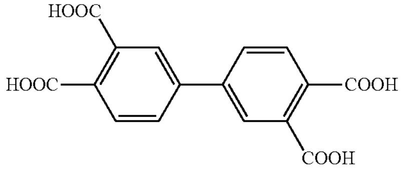

Formula (A-10)

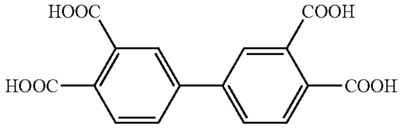

Formula (A-11)

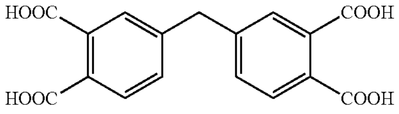

Formula (A-12)

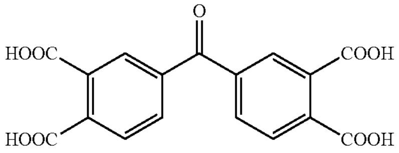

Formula (A-13)

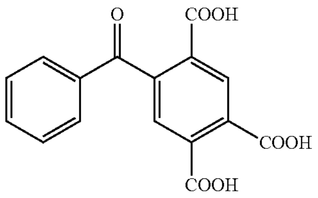

Formula (A-14)

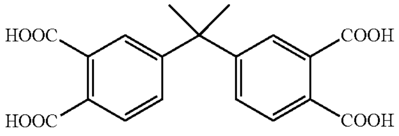

Formula (A-15)

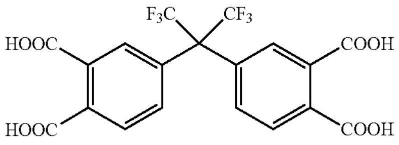

-continued

Formula (A-16)

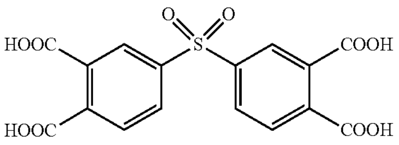

Formula (A-17)

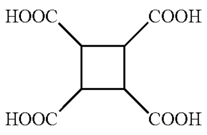

Formula (A-18)

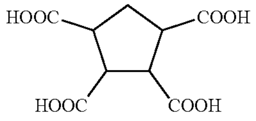

Formula (A-19)

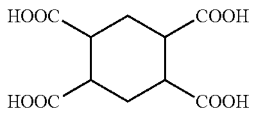

Formula (A-20)

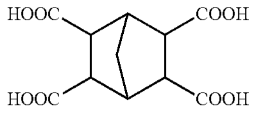

Formula (A-21)

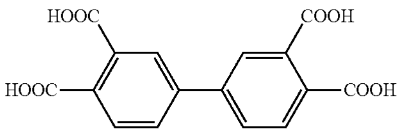

Formula (A-22)

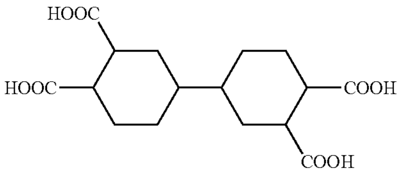

and

Formula (A-23)

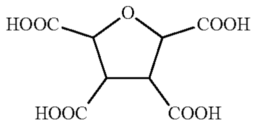

Formula (A-24)

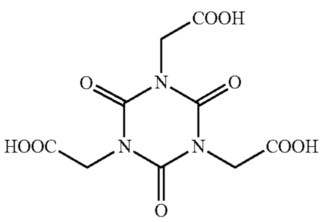

-continued

Formula (A-25)

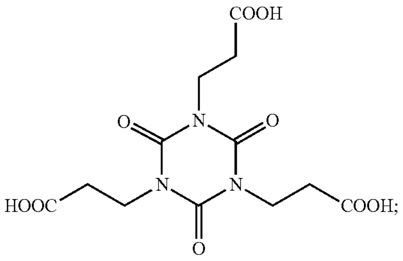

(B) a reaction product (B1) of a diepoxy compound (C) and a bi- or more functional proton generating compound (D), or a monomer (B2) obtained by the reaction of a polyfunctional epoxy compound with a proton generating compound, and a solvent.

9. The protective film forming composition against a wet etching liquid for semiconductor according to claim 8, wherein the reaction product (B1) of a diepoxy compound (C) and a bi- or more functional proton generating compound (D), or the monomer (B2) obtained by the reaction of a polyfunctional epoxy compound with a proton generating compound has at least one hydroxy group in a unit structure of the reaction product or in the molecule of the monomer.

10. The protective film forming composition against a wet etching liquid for semiconductor according to claim 8, further comprising at least one member selected from the group consisting of cross-linking agent, cross-linking catalyst, and surfactant.

11. The protective film forming composition against a wet etching liquid for semiconductor according to claim 8, wherein the wet etching liquid for semiconductor comprises a hydrogen peroxide solution.

12. A protective film against a wet etching liquid for semiconductor, which is a baked product of an applied film of the protective film forming composition according to claim 8.

13. A method for producing a substrate having a resist pattern comprising the steps of:

applying the protective film forming composition according to claim 8 onto a semiconductor substrate and baking the applied composition to form a protective film as a resist underlying film, forming a resist film on the protective film, and then forming a resist pattern by exposure and development, wherein the substrate having a resist pattern is for manufacturing a semiconductor.

14. A method for producing a semiconductor device comprising the steps of:

forming a protective film on a semiconductor substrate optionally having an inorganic film formed on a surface thereof using the protective film forming composition according to claim 8;

forming a resist pattern on the protective film;

subjecting the protective film to dry etching using the resist pattern as a mask so as to expose a surface of the inorganic film or the semiconductor substrate; and while using the dry-etched protective film as a mask, subjecting the inorganic film or the semiconductor substrate to wet etching and/or to washing using a wet etching liquid for semiconductor.

15. The protective film forming composition against a wet etching liquid for semiconductor according to claim 1, wherein the resin or monomer (B) is selected from the group consisting of polyester, polyether, polyether ether ketone, polyamide, polyimide, novolac resin, maleimide resin, acrylic resin and methacrylic resin.

* * * * *